(12) United States Patent
Woody et al.

(10) Patent No.: US 11,091,585 B2
(45) Date of Patent: Aug. 17, 2021

(54) POLYMERS CONTAINING 3'-(ALKOXY)-[2,2'-BITHIOPHENE]-3-CARBONITRILE FOR HIGH PERFORMANCE ORGANIC PHOTOVOLTAICS

(71) Applicant: PHILLIPS 66 COMPANY, Houston, TX (US)

(72) Inventors: Kathy Woody, Bartlesville, OK (US); Laura Nielsen, Bartlesville, OK (US); Hualong Pan, Bartlesville, OK (US)

(73) Assignee: PHILLIPS 66 COMPANY, Houston, TX (US)

( * ) Notice: Subject to any disclaimer, the term of this patent is extended or adjusted under 35 U.S.C. 154(b) by 0 days.

(21) Appl. No.: 16/511,798

(22) Filed: Jul. 15, 2019

(65) Prior Publication Data

US 2020/0017633 A1    Jan. 16, 2020

Related U.S. Application Data

(60) Provisional application No. 62/698,681, filed on Jul. 16, 2018.

(51) Int. Cl.
*C08G 61/12* (2006.01)
*H01L 51/00* (2006.01)
(Continued)

(52) U.S. Cl.
CPC .......... *C08G 61/126* (2013.01); *C08L 65/00* (2013.01); *H01L 51/0036* (2013.01);
(Continued)

(58) Field of Classification Search
CPC .......... C08G 61/126; C08G 2261/3243; C08G 2261/414; C08G 2261/124;
(Continued)

(56) References Cited

PUBLICATIONS

Fu et al. Phys. Chem. Chem. Phys., 2015, 17, 2043-2053.*
(Continued)

*Primary Examiner* — Shane Fang
(74) *Attorney, Agent, or Firm* — Phillips 66 Company

(57) ABSTRACT

A novel AB-type copolymer for use in organic photovoltaics. The AB-type copolymer comprises
a unit A, where the unit A is

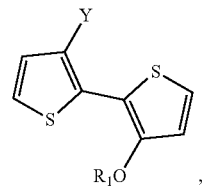

where $R_1$ is a carbon chain from about 1 to about 30 units and where Y is selected from CN, F and Cl. The B unit of the AB-type copolymer is selected from is selected from:

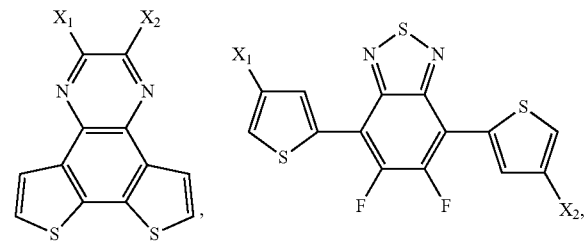

(Continued)

CONVENTIONAL DEVICE ARCHITECTURE

INVERTED DEVICE ARCHITECTURE

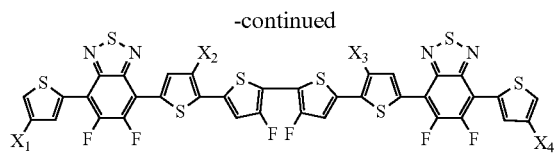

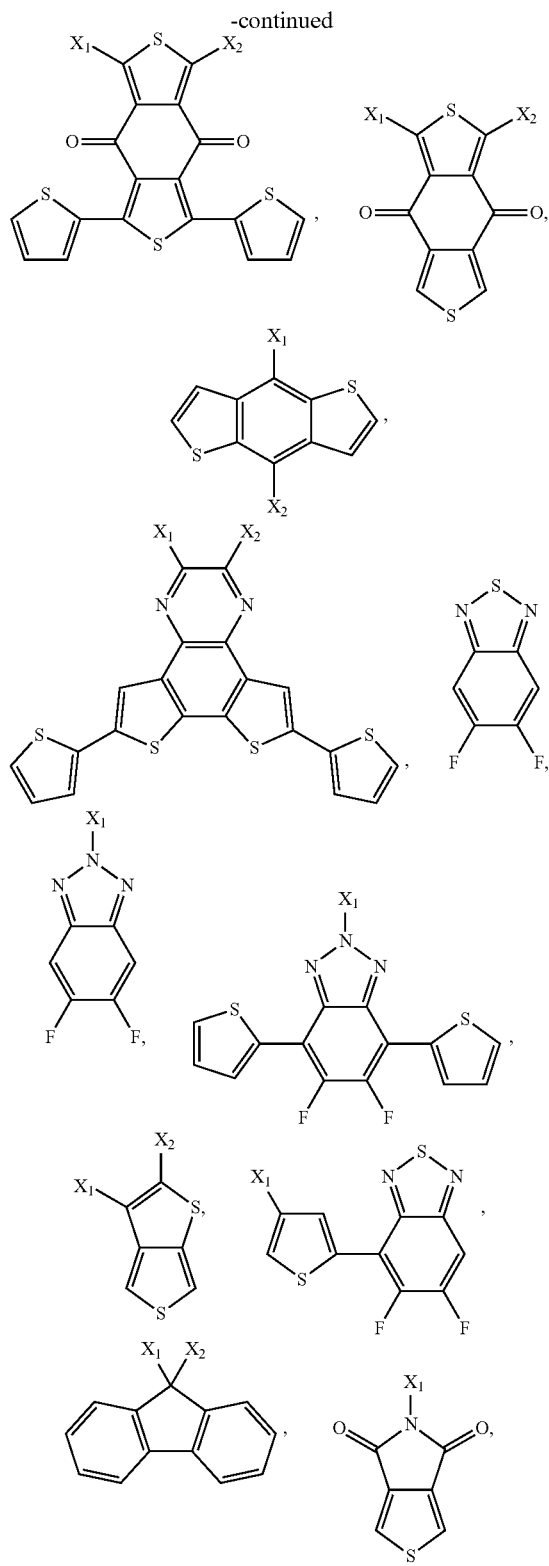

wherein $X_1$, $X_2$, $X_3$, and $X_4$ are independently selected from the group consisting of: H, Cl, F, CN, alkyl, alkylthio, alkoxy, ester, ketone, amide and aryl groups.

11 Claims, 14 Drawing Sheets

(51) Int. Cl.
 *C08L 65/00* (2006.01)
 *H01L 51/42* (2006.01)

(52) U.S. Cl.
 CPC ...... *H01L 51/0043* (2013.01); *C08G 2261/12* (2013.01); *C08G 2261/1412* (2013.01); *C08G 2261/1424* (2013.01); *C08G 2261/314* (2013.01); *C08G 2261/3223* (2013.01); *C08G 2261/3229* (2013.01); *C08G 2261/3243* (2013.01); *C08G 2261/3246* (2013.01); *C08G 2261/334* (2013.01); *C08G 2261/91* (2013.01); *C08L 2203/204* (2013.01); *H01L 51/42* (2013.01)

(58) Field of Classification Search
 CPC . C08G 2261/91; C08L 65/00; H01L 51/0036; H01L 51/0047; H01L 51/0043
 See application file for complete search history.

(56) References Cited

PUBLICATIONS

Solenn Berson, Samy Cecioni, Martial Billon, Yann Kervella, Remi de Bettignies, Severine Bailly, Stephane Guillerez, "Effect of Carbonitrile and Hexyloxy Substituents on Alternated Copolymer of Polythiophene-Performances in Photovoltaic Cells", Solar Energy Materials & Solar Cells, 94, (2010), pp. 699-708.

Ulrike Salzner, Department of Chemistry, Bilkent University, 06533 Bilkent, Ankara, Turkey, "Does the Donor-Acceptor Concept Work for Designing Synthetic Metals? 1. Theoretical Investigation of Poly(3-cyano-3'-hydroxybithiophene)", J. Phys. Chem. B 2002, 106, pp. 9214-9220.

Noémie Hergué, Charlotte Mallet, Gurunathan Savitha, Magali Allain, Pierre Frère, and Jean Roncali, "Facile Synthesis of 3-Alkoxy-4-Cyanothiophenes As New Building Blocks for Donor-Acceptor Conjugated Systems", Jan. 30, 2011, vol. 13, No. 7, pp. 1762-1765.

\* cited by examiner (x = 0.7, y+z = 0.3)

POLYMERS CONTAINING 3'-(ALKOXY)-[2,2'-BITHIOPHENE]-3-CARBONITRILE FOR HIGH PERFORMANCE ORGANIC PHOTOVOLTAICS

CROSS-REFERENCE TO RELATED APPLICATIONS

This application is a non-provisional application which claims the benefit of and priority to U.S. Provisional Application Ser. No. 62/698,681 filed Jul. 16, 2018, titled "Polymers Containing 3'-(Alkoxy)-[2,2'-Bithiophene]-3-Carbonitrile For High Performance Organic Photovoltaics," which is hereby incorporated by reference in its entirety.

STATEMENT REGARDING FEDERALLY SPONSORED RESEARCH OR DEVELOPMENT

None.

FIELD OF THE INVENTION

This invention relates to the use of 3'-(alkoxy)-[2,2'-bithiophene]-3-carbonitrile in organic photovoltaics.

BACKGROUND OF THE INVENTION

Solar energy using photovoltaics requires active semiconducting materials to convert light into electricity. Currently, solar cells based on silicon are the dominating technology due to their high-power conversion efficiency. Recently, solar cells based on organic materials showed interesting features, especially on the potential of low cost in materials and processing.

Organic photovoltaic cells have many potential advantages when compared to traditional silicon-based devices. Organic photovoltaic cells are light weight, economical in the materials used, and can be deposited on low cost substrates, such as flexible plastic foils. However, organic photovoltaic devices typically have relatively low power conversion efficiency (the ratio of incident photons to energy generated).

There exists a need for a polymer to create organic photovoltaic cells that has high power conversion efficiency while maintaining open-circuitry voltage short-circuit current density, and fill factor.

BRIEF SUMMARY OF THE DISCLOSURE

A novel AB-type copolymer for use in organic photovoltaics. The AB-type copolymer comprises a unit A, where the unit A is

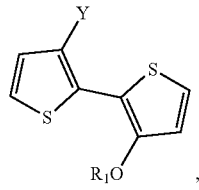

where $R_1$ is a carbon chain from about 1 to about 30 units and where Y is selected from CN, F and Cl. The B unit of the AB-type copolymer is selected from is selected from:

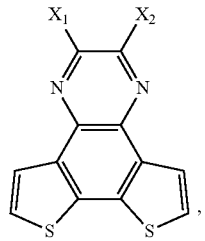

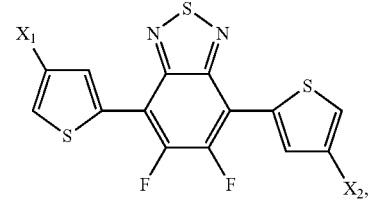

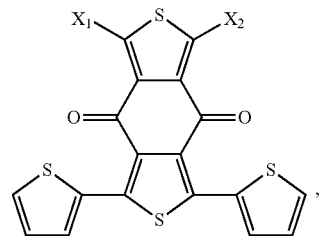

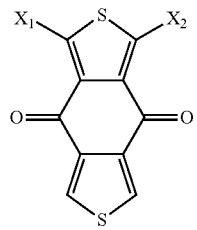

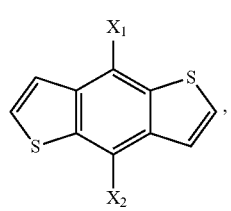

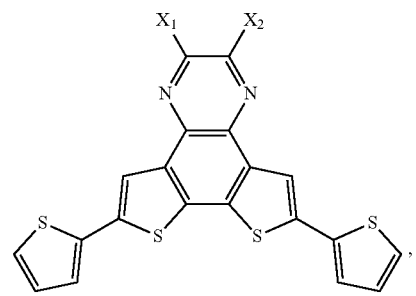

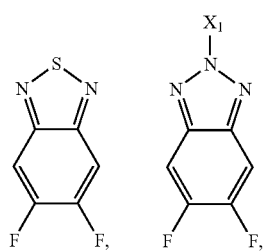

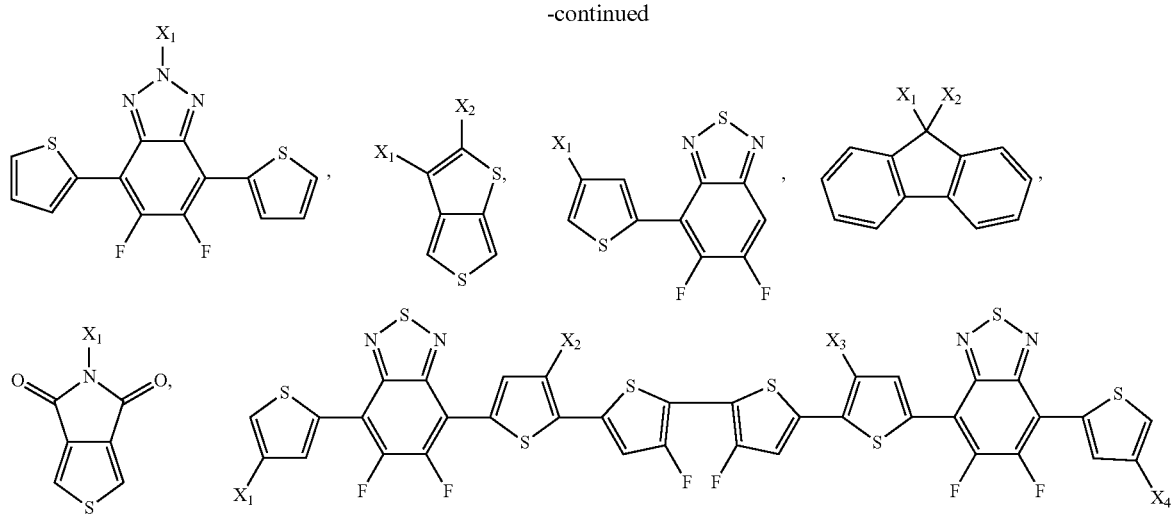

wherein $X_1$, $X_2$, $X_3$, and $X_4$ are independently selected from the group consisting of: H, Cl, F, CN, alkyl, alkylthiol, alkoxy, ester, ketone, amide and aryl groups.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment the aliphatic hydrocarbon chains are of 1 to about 100 carbon atoms, preferably 1 to 30 carbon atoms, more preferably, 1 to 20 carbon atoms, and even more preferably, and includes straight and branched chains such as methyl, ethyl, n-propyl, isopropyl, n-butyl, isobutyl, sec-butyl, t-butyl, n-pentyl, isopentyl, neo-pentyl, n-hexyl, and isohexyl. In this application alkyl groups can include the possibility of substituted and unsubstituted alkyl groups.

"Alkylthiol," as used herein, refers to alkyl groups with a sulfanyl group (—SH) attached.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 20 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups.

"Ester", as used herein, represents a group of formula —COOR wherein R represents an "alkyl", "aryl", a "heterocycloalkyl" or "heteroaryl" moiety, or the same substituted as defined above.

"Ketone" as used herein, represents an organic compound having a carbonyl group linked to a carbon atom such as —C(O)Rx wherein Rx can be alkyl, aryl, cycloalkyl, cycloalkenyl or heterocycle.

"Amide" as used herein, represents a group of formula "—C(O)NR$^x$R$^y$," wherein R$^x$ and R$^y$ can be the same or independently H, alkyl, aryl, cycloalkyl, cycloalkenyl or heterocycle.

The following examples of certain embodiments of the invention are given. Each example is provided by way of explanation of the invention, one of many embodiments of the invention, and the following examples should not be read to limit, or define, the scope of the invention.

Device Architecture

Figure 1:
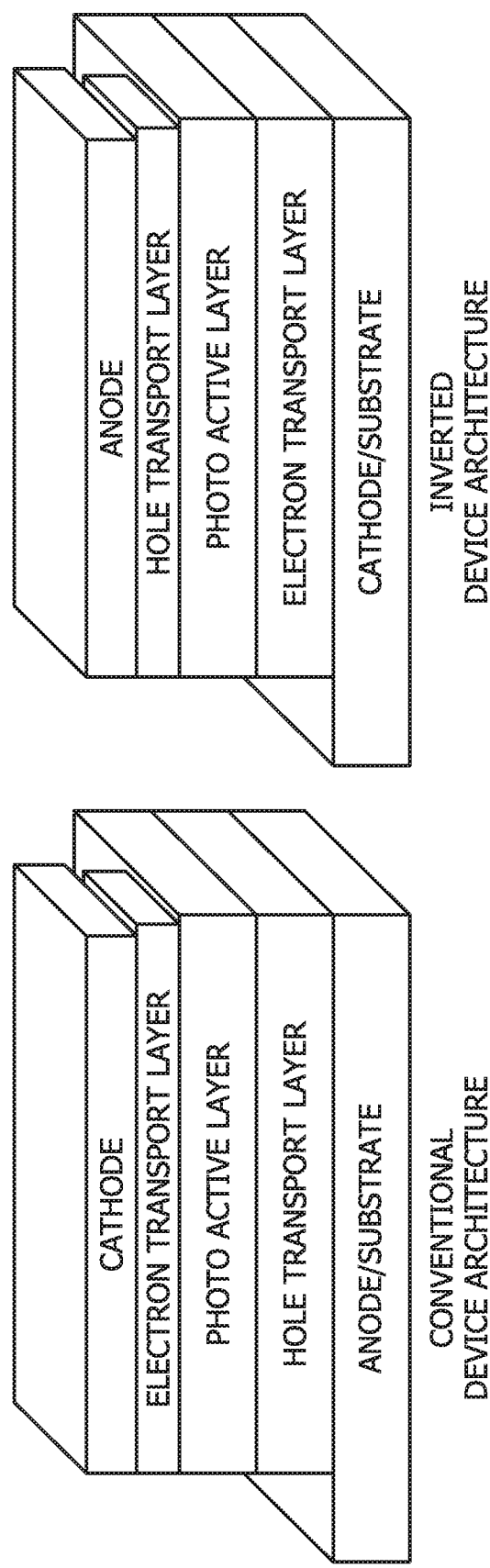
FIG. 1 depicts a conventional device architecture and an inverted device architecture.

When used as a photovoltaic device the architecture may be a conventional architecture device, while in others it may be an inverted architecture device. A conventional architecture device typically comprised of multilayered structure with a transparent anode as a substrate to collect positive charge (holes) and a cathode to collect negative charge (electrons), and a photo-active layer sandwiched in between two electrodes. An additional charge transport interlayer is inserted in between active layer and electrode for facile hole and electron transport. Each charge transport layer can be consisted of one or more layers. An inverted device has the same multilayered structure as the conventional architecture device whereas it uses a transparent cathode as a substrate to collect electrons and an anode to collect holes. The inverted device also has the photo-active layer and additional charge transport layers sandwiched in between two electrodes. FIG. 1 depicts a conventional device architecture and an inverted device architecture.

AB-Type Copolymer

In one embodiment the AB-type copolymer is used in organic photovoltaics. The AB-type copolymer can comprise a unit A, where the unit A is

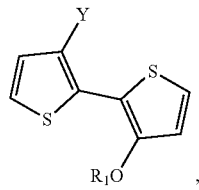

where $R_1$ is a carbon chain from about 1 to about 30 units and where Y is selected from CN, F and Cl. The B unit of the AB-type copolymer can be selected from:

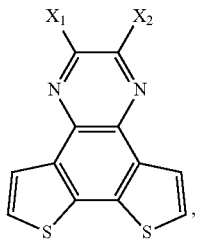 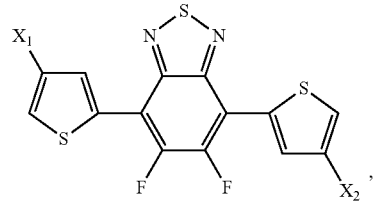 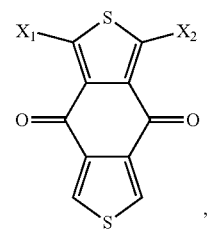 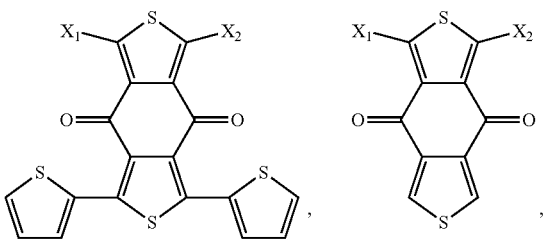

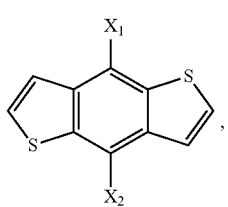 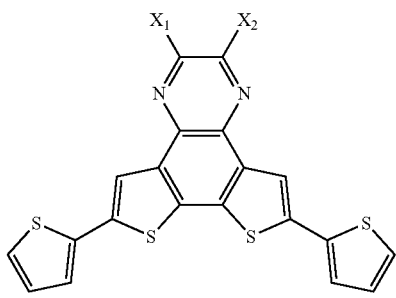 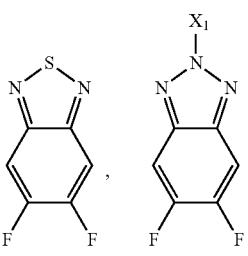

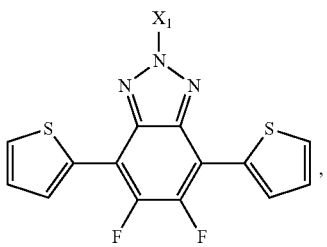 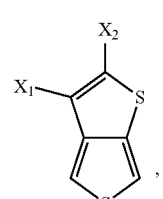 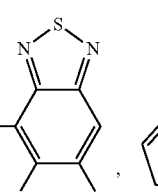 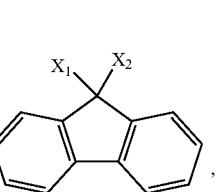 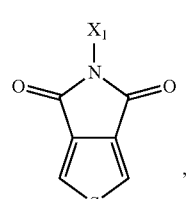

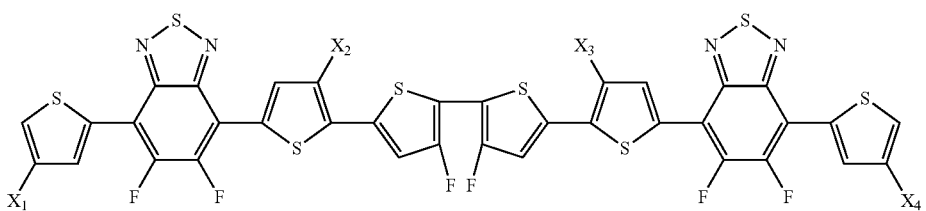

wherein

X₁, X₂, X₃, and X₄ are independently selected from the group consisting of: H, Cl, F, CN, alkyl, alkylthiol, alkoxy, ester, ketone, amide and aryl groups.

In one embodiment R₁ can be a branched or unbranched carbon chain. Additionally, the AB-type copolymer can be used to form a polymer with a length n from about 1 to about 100,000 repeat units. In other features of this embodiment, the number of AB-type copolymer in the polymer can range from about 10 to about 75,000 repeat units, about 100 to about 50,000 repeat units or even from about 1,000 to about 20,000 repeat units.

In one embodiment, the AB copolymers can be positioned either AB or BA. Within an actual polymer it is envisioned that the polymer m can be regio-regular or regio-random using AB and/or BA copolymer. It is also envisioned that the polymer can be used as a photovoltaic material or as an active layer in an electronic device.

Example AB-type copolymers can include:

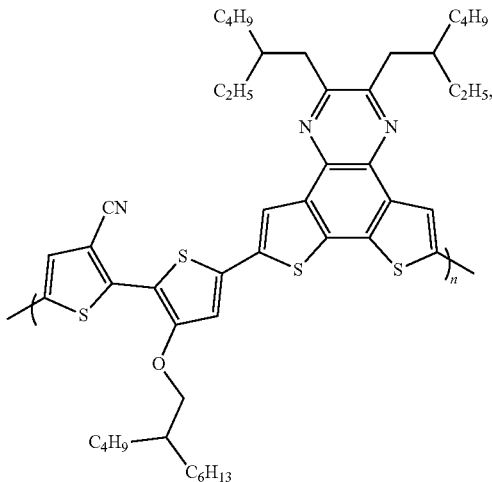

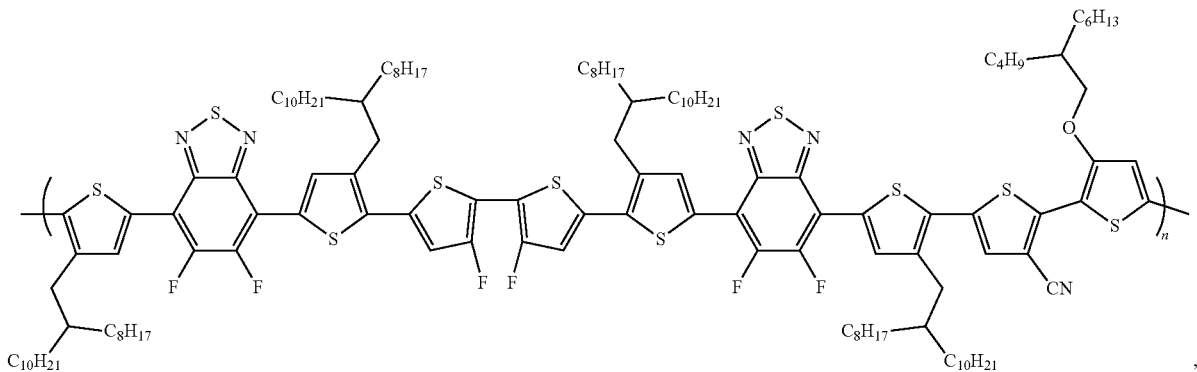

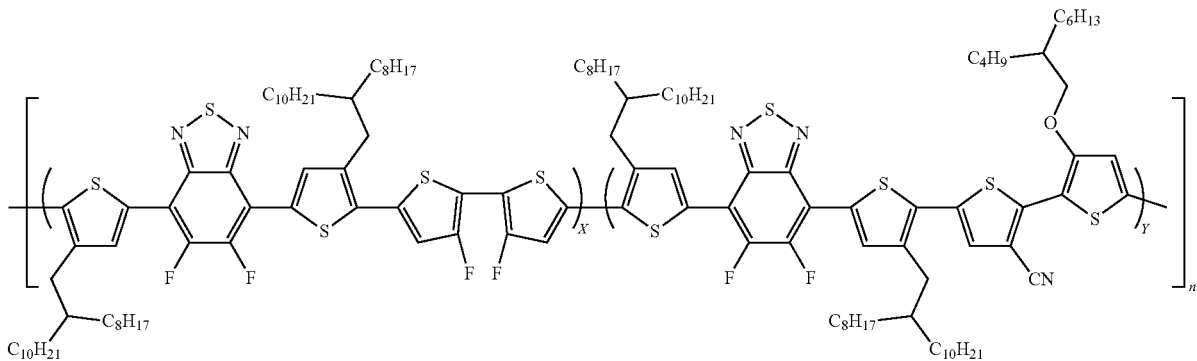

wherein X+Y=1 and X and Y can range from 0.01 to about 0.99,
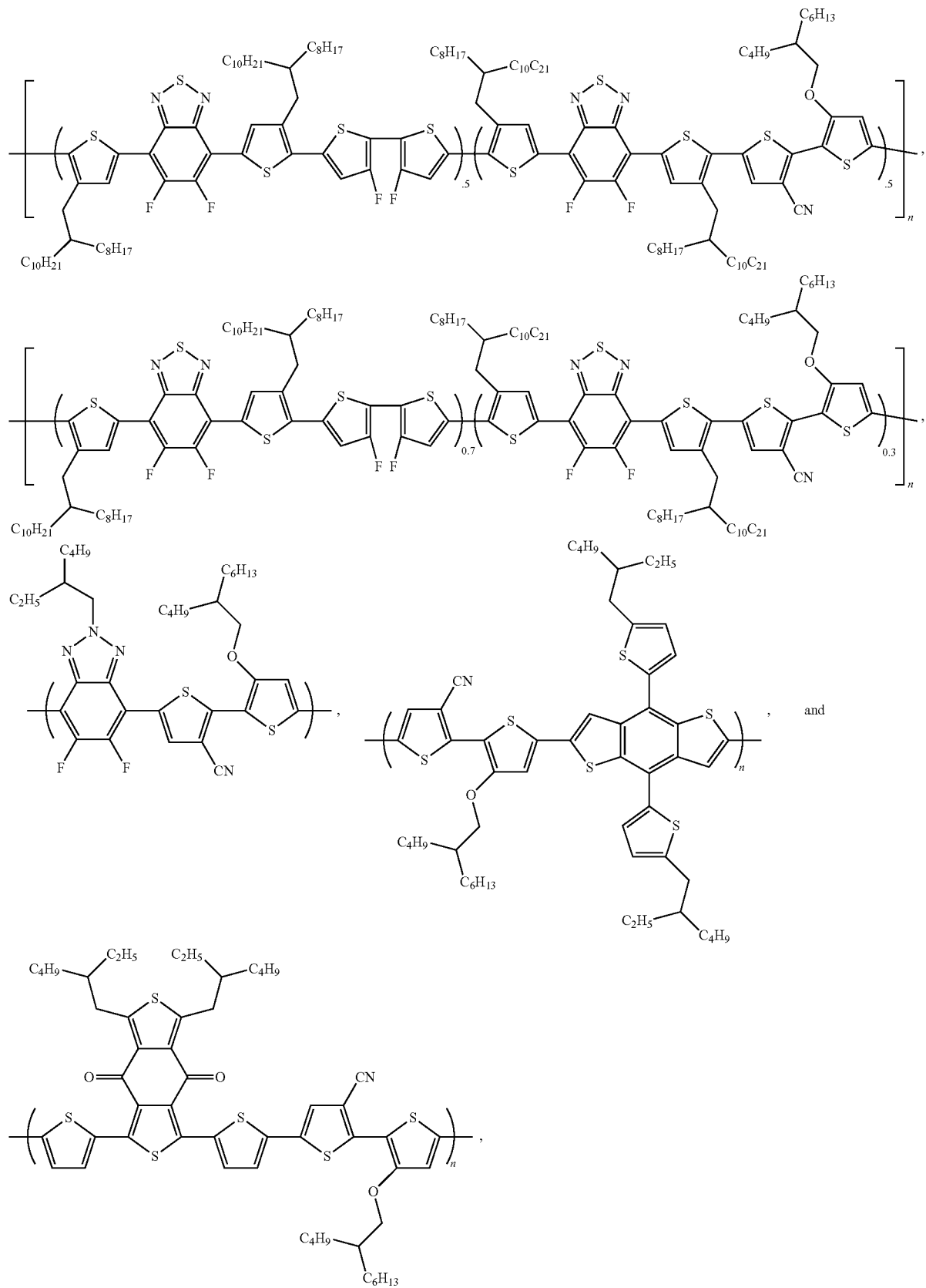

wherein n can range from about 1 to about 1000 for all these polymers.

Monomer Synthesis

To begin the process of making the AB-type copolymer unit A must first be formed. In one non-limiting embodiment unit A can be formed by of 3'-((2-butyloctyl)oxy)-5,5'-bis (trimethylstannyl)-[2,2'-bithiophene]-3-carbonitrile. Furthering this non-limiting embodiment, the formation of 3'-((2-butyloctyl)oxy)-5,5'-bis(trimethylstannyl)-[2,2'-bithiophene]-3-carbonitrile begins by first generating the 3-((2-butyloctyl)oxy)thiophene as shown by the following equation:

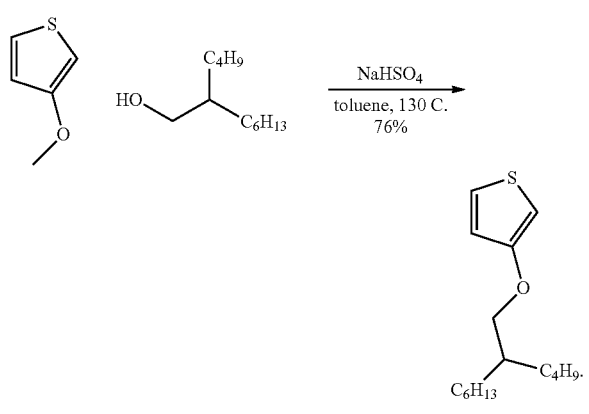

Figure 2:
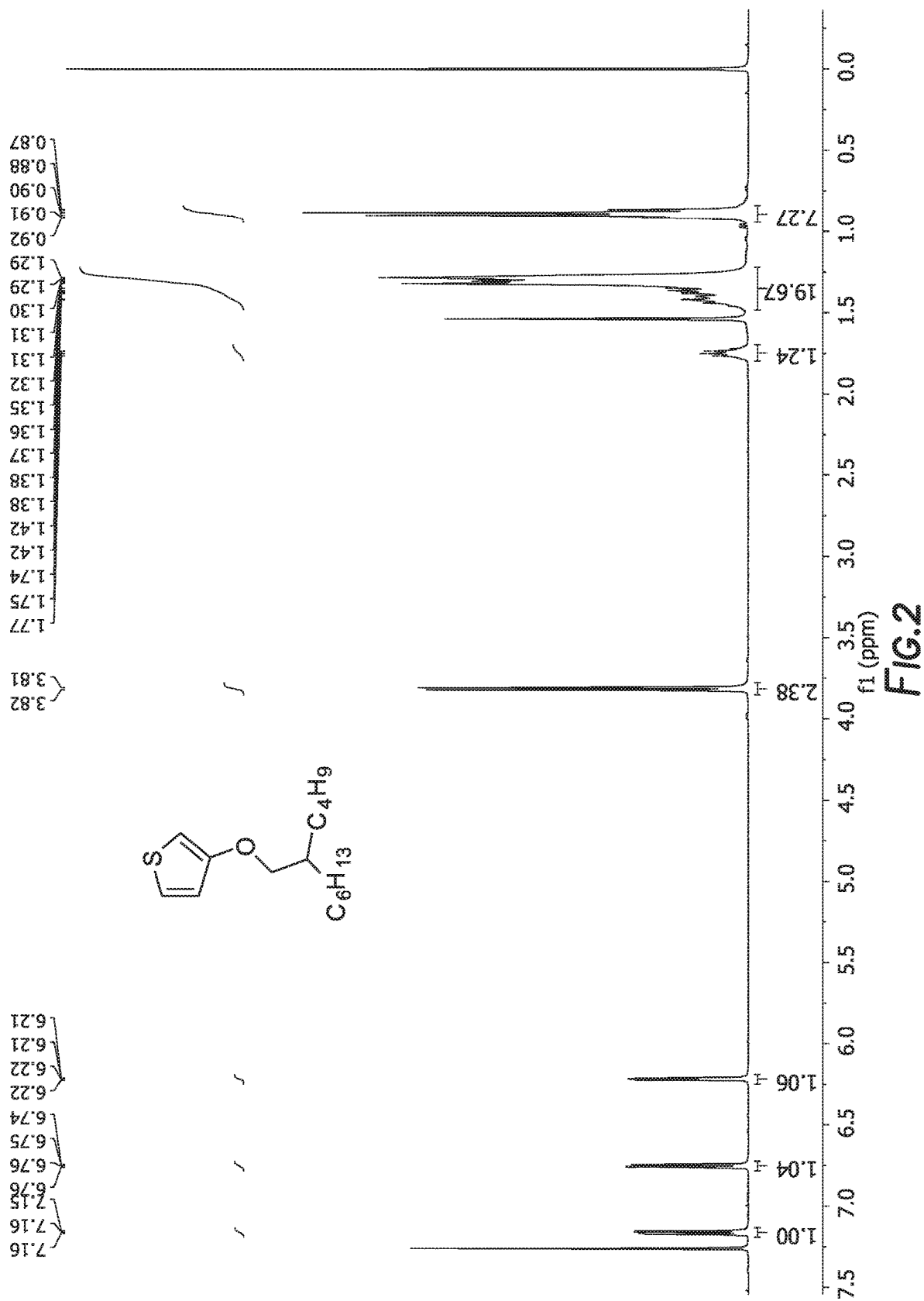
FIG. 2 depicts the $^1$H NMR spectrum of 3-((2-butyloctyl)oxy)thiophene.

A hot, oven-dried round bottom flask topped with a water condenser and argon inlet was evacuated and refilled with argon. Sodium bisulfate (0.5 g, 4 mmol), 3-methoxythiophene (3.0 g, 26.3 mmol), 2-butyloctanol (5.88 mL, 26.3 mmol), and toluene (100 mL) were added under argon. The mixture was stirred at room temperature for 30 minutes under argon, then heated to 130° C. for 20 hours. After the reaction cooled to room temperature, it was diluted with an aqueous saturated sodium bicarbonate solution, transferred to a separatory funnel, and extracted with ethyl acetate (3×). The combined organic extracts were dried (MgSO$_4$), filtered, and concentrated. The material was dissolved in a small amount of hexanes, applied to the top of a 100 g Biotage column, and eluted with 100% hexanes. Fractions were checked by GC-MS, and fractions with >99% purity were combined to afford 3-((2-butyloctyl)oxy)thiophene (5.37 g, 76% yield) as a yellow oil. The $^1$H NMR spectrum of 3-((2-butyloctyl)oxy)thiophene is shown in FIG. 2.

2-bromo-3-((2-butyloctyl)oxy)thiophene is then generated by the following equation:

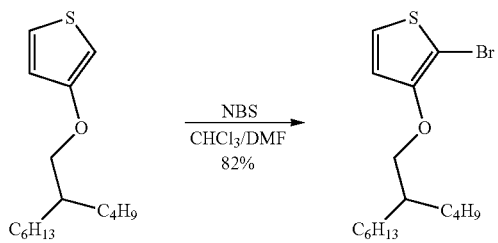

Figure 3:
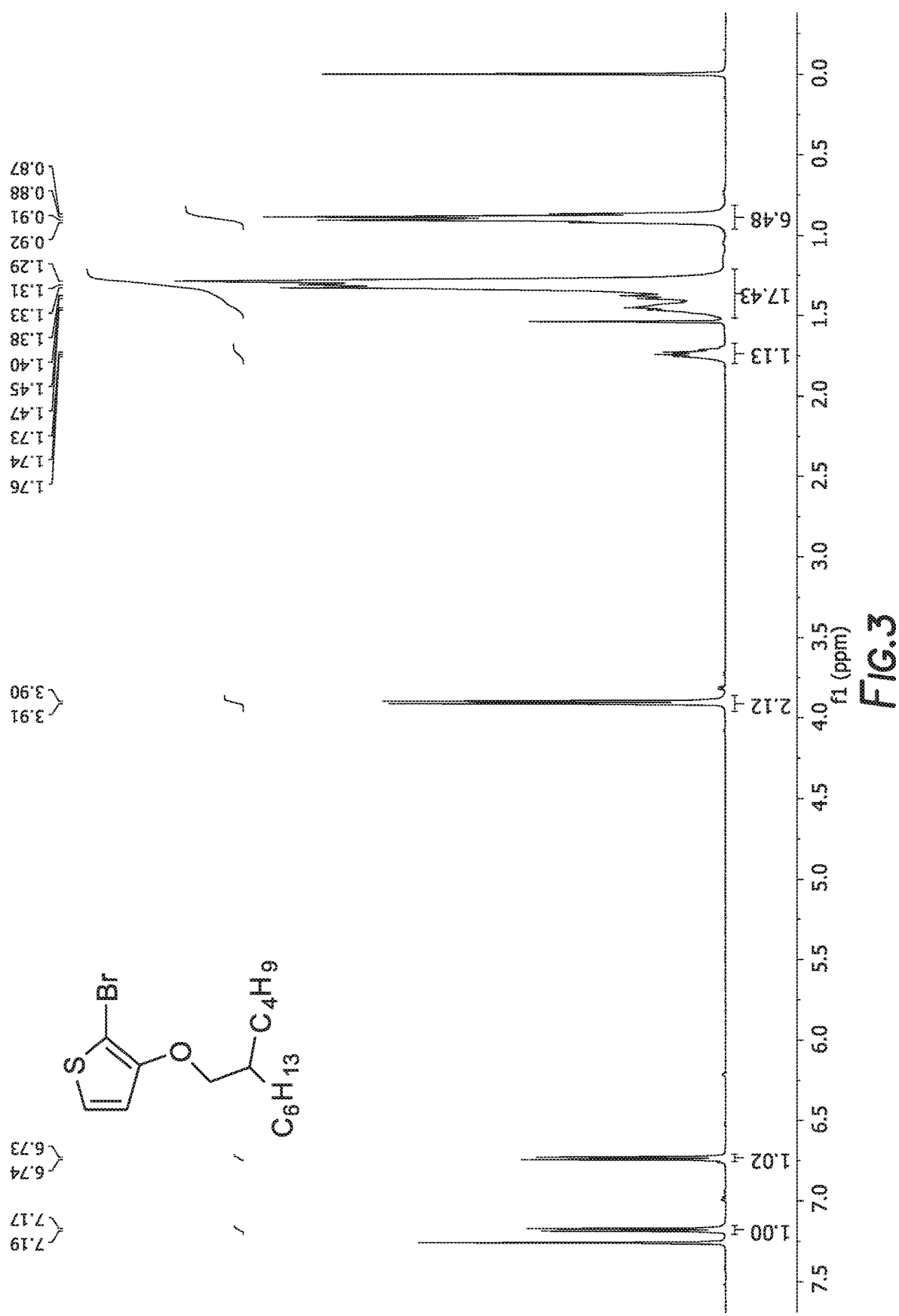
FIG. 3 depicts the $^1$H NMR spectrum of 2-bromo-3-((2-butyloctyl)oxy)thiophene.

3-((2-Butyloctyl)oxy)thiophene (2.96 g, 11 mmol) was dissolved in chloroform (36 mL). The flask was wrapped in foil, and the solution was cooled to 0° C. in an ice-water bath. A solution of N-bromosuccinimide (1.86 g, 10 mmol) in N,N-dimethylformamide (5.5 mL) was added dropwise, and the reaction was stirred at 0° C. for one hour then at room temperature for 16 hours. The reaction was quenched with water and extracted with dichloromethane (3×). The combined organic extracts were dried (MgSO$_4$), filtered, and concentrated. The crude material was dissolved in a small amount of hexanes, applied to the top of a 100 g Biotage column, and eluted with a 0-4% dichloromethane/hexanes gradient. Fractions were checked by GC-MS, and fractions with >95% purity were combined to afford 2-bromo-3-((2-butyloctyl)oxy)thiophene (3.15 g, 82% yield). The $^1$H NMR spectrum of 2-bromo-3-((2-butyloctyl)oxy)thiophene is shown in FIG. 3.

3'-((2-butyloctyl)oxy)-[2,2'-bithiophene]-3-carbonitrile is then generated by the following equation:

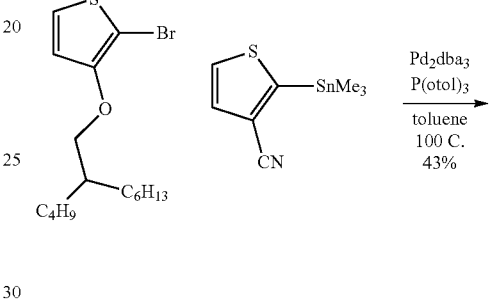

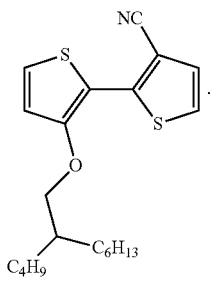

Figure 4:
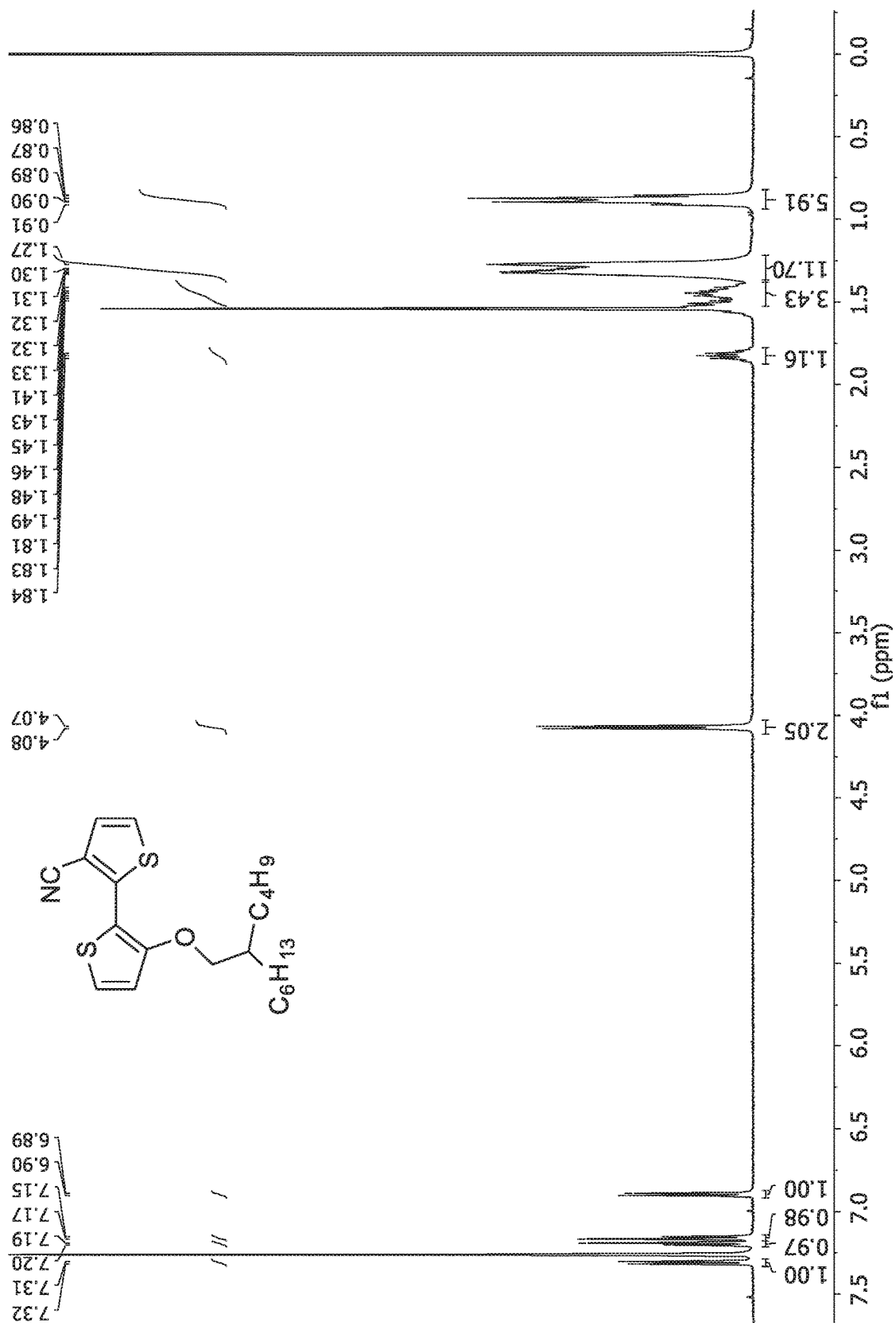
FIG. 4 depicts the $^1$H NMR spectrum of 3'-((2-butyloctyl)oxy)-[2,2'-bithiophene]-3-carbonitrile.

In a Schlenk flask, 2-bromo-3-((2-butyloctyl)oxy)thiophene (2.0 g, 5.8 mmol), 2-bromo-3-cyanothiophene (1.72 g, 6.3 mmol), tris(dibenzylideneacetone)dipalladium(0) (210 mg, 0.23 mmol), and tri(o-tolyl)phosphine (280 mg, 0.92 mmol) were combined. The flask was evacuated and refilled with argon (3×). Dry toluene (50 mL) was added, and three freeze-pump-thaw cycles were completed to degas the solvent. The reaction was heated to 100° C. for 16 hours. The reaction mixture was diluted with water and extracted with dichloromethane (3×). The combined organic extracts were dried (MgSO$_4$), filtered, and concentrated. The crude material was dissolved in a small amount of hexanes, applied to the top of a 100 g Biotage column, and eluted with a 0-100% dichloromethane/hexanes gradient. Fractions containing the desired product were concentrated to afford 3'-((2-butyloctyl)oxy)-[2,2'-bithiophene]-3-carbonitrile (925 mg, 43% yield) as a yellow oil. The $^1$H NMR spectrum of 3'-((2-butyloctyl)oxy)-[2,2'-bithiophene]-3-carbonitrile is shown in FIG. 4.

Finally, 3'-((2-butyloctyl)oxy)-5,5'-bis(trimethylstannyl)-[2,2'-bithiophene]-3-carbonitrile is created by the following equation:

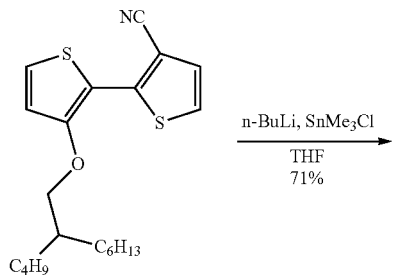

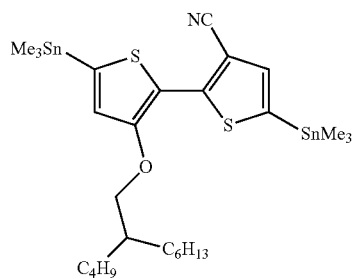

Figure 5:
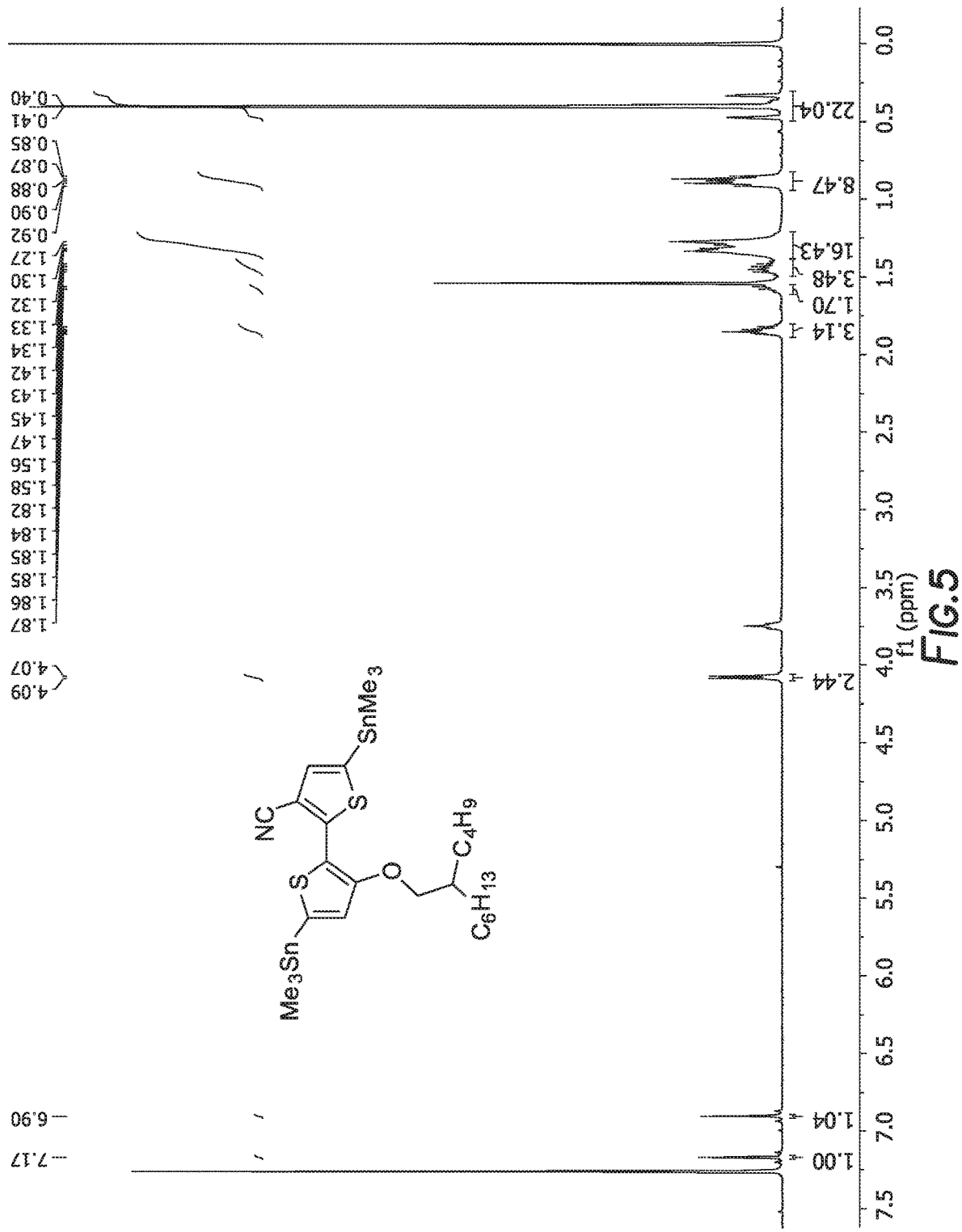
FIG. 5 depicts the $^1$H NMR spectrum of 3'-((2-butyloctyl)oxy)-5,5'-bis(trimethylstannyl)-[2,2'-bithiophene]-3-carbonitrile.

A hot, oven-dried Schlenk flask containing 3'-((2-butyloctyl)oxy)-[2,2'-bithiophene]-3-carbonitrile (925 mg, 2.46 mmol) was evacuated for 30 minutes, then refilled with argon. Dry THF (25 mL) was added to the flask, the solution was cooled to −78° C., and n-butyl lithium (2.5 M in hexanes, 2.36 mL, 5.91 mmol was added dropwise. The reaction was stirred at −78° C. for one hour, then at room temperature for 30 minutes. The reaction was again cooled to −78° C. and treated slowly with trimethyltin chloride (1 M in THF, 6.65 mL, 6.65 mmol). The reaction was then gradually warmed to room temperature and stirred for 16 hours. The reaction was quenched with water and extracted with dichloromethane (3×). The combined organic extracts were washed with water (2×), then dried (MgSO$_4$), filtered, and concentrated. The crude material was purified by recrystallization from ethanol to afford 3'-((2-butyloctyl)oxy)-5,5'-bis(trimethylstannyl)-[2,2'-bithiophene]-3-carbonitrile (1.22 g, 71% yield) as a tan solid. The $^1$H NMR spectrum of 3'-((2-butyloctyl)oxy)-5,5'-bis(trimethylstannyl)-[2,2'-bithiophene]-3-carbonitrile is shown in FIG. 5.

Anode

When used in as an organic photovoltaic device the polymer can be used in conjunction with an anode. The anode for the organic photovoltaic device can be any conventionally known anode capable of operating as an organic photovoltaic device. Examples of anodes that can be used include: indium tin oxide, aluminum, silver, carbon, graphite, graphene, PEDOT:PSS, copper, metal nanowires, $Zn_{99}InO_x$, $Zn_{98}In_2O_x$, $Zn_{97}In_3O_x$, $Zn_{95}Mg_5O_x$, $Zn_{90}Mg_{10}O_x$, and $Zn_{85}Mg_{15}O_x$.

Cathode

When used in as an organic photovoltaic device the polymer can be used in conjunction with a cathode. The cathode for the organic photovoltaic device can be any conventionally known cathode capable of operating as an organic photovoltaic device. Examples of cathodes that can be used include: indium tin oxide, carbon, graphite, graphene, PEDOT:PSS, copper, silver, aluminum, gold, metal nanowires.

Electron Transport Layer

When used in as an organic photovoltaic device the copolymer can be deposited onto an electron transport layer. Any commercially available electron transport layer can be used that is optimized for organic photovoltaic devices. In one embodiment the electron transport layer can comprise $(AO_x)_yBO_{(1−y)}$. In this embodiment, $(AO_x)_y$ and $BO_{(1−y)}$ are metal oxides. A and B can be different metals selected to achieve ideal electron transport layers. In one embodiment A can be aluminum, indium, zinc, tin, copper, nickel, cobalt, iron, ruthenium, rhodium, osmium, tungsten, magnesium, indium, vanadium, titanium and molybdenum.

In one embodiment B can be aluminum, indium, zinc, tin, copper, nickel, cobalt, iron, ruthenium, rhodium, osmium, tungsten, vanadium, titanium and molybdenum.

Examples of $(AO_x)_yBO_{(1−y)}$ include: $(SnO_x)_yZnO_{(1−y)}$, $(AlO_x)_yZnO_{(1−y)}$, $(AlO_x)_yInO_{z\ (1−y)}$, $(AlO_x)_ySnO_{z\ (1−y)}$, $(AlO_x)_yCuO_{z\ (1−y)}$, $(AlO_x)_yWO_{z\ (1−y)}$, $(InO_x)_yZnO_{(1−y)}$, $(InO_x)_ySnO_{z\ (1−y)}$, $(InO_x)_yNiO_{z\ (1−y)}$, $(ZnO_x)_yCuO_{z\ (1−y)}$, $(ZnO_x)_yNiO_{z\ (1−y)}$, $(ZnO_x)_yFeO_{z\ (1−y)}$, $(WO_x)_yVO_{z\ (1−y)}$, $(WO_x)_yTiO_{z\ (1−y)}$, and $(WO_x)_yMoO_{z\ (1−y)}$.

In an alternate embodiment, various fullerene dopants can be combined with $(AO_x)_yBO_{(1−y)}$ to make an electron transport layer for the organic photovoltaic device. Examples of fullerene dopants that can be combined include

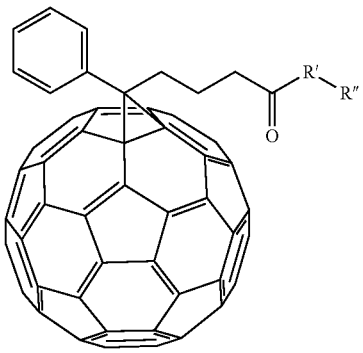

and [6,6]-phenyl-C$_{60}$-butyric-N-2-trimethylammonium ethyl ester iodide.

In the embodiment of

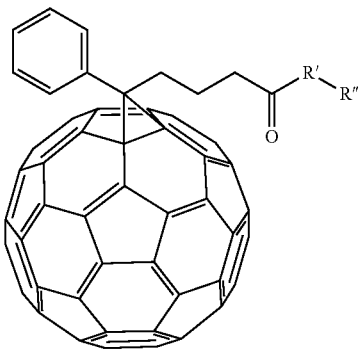

R' can be selected from either N, O, S, C, or B. In other embodiment R" can be alkyl chains or substituted alkyl chains. Examples of substitutions for the substituted alkyl chains include halogens, N, Br, O, Si, or S. In one example R" can be selected from

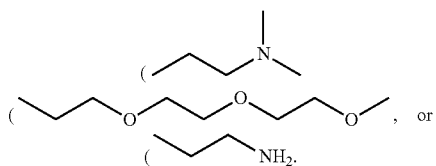

Other examples of fullerene dopants that can be used include: [6,6]-phenyl-$C_{60}$-butyric-N-(2-aminoethyl)acetamide, [6,6]-phenyl-$C_{60}$-butyric-N-triethyleneglycol ester and [6,6]-phenyl-$C_{60}$-butyric-N-2-dimethylaminoethyl ester.

Organic Photovoltaic Device Fabrication

Zinc/tin oxide (ZTO):phenyl-C60-butyric-N-(2-hydroxyethyl)acetamide (PCBNOH) sol-gel solution was prepared by dissolving zinc acetate dihydrate or tin(II) acetate in 2-methoxyethanol and ethanolamine. Specifically, the ZTO:PCBNOH sol-gel electron transport layer solution was prepared by mixing $Zn(OAc)_2$ (3.98 g), $Sn(OAc)_2$ (398 mg) and PCBNOH (20.0 mg) in 2-methoxyethanol (54 mL) with ethanolamine (996 μL). Solutions were then further diluted to 65 vol % by adding more 2-methoxyethanol and stirred for at least an hour before spin casting onto indium tin oxide substrate to form the electron transport layer.

In alternate embodiments, the formation of ZTO ([6,6]-phenyl-$C_{60}$-butyric-N-2-trimethylammonium ethyl ester iodide (PCBNMI) can be used as well. One method of forming PCBNMI can be taking [6,6]-phenyl-C60-butyric-N-2-dimethylaminoethyl ester (0.05 g, 0.052 mmol) and dissolved it in dry THF (2 mL) under argon. Iodomethane (1.5 mL) was added in one portion and the vessel was sealed. The solution is then heated to 60° C. for 18 hours. The solution was cooled and opened to allow the liquids to evaporate. The solid residue was suspended in methanol, diluted with acetone, and centrifuged. This process was repeated to produce [6,6]-phenyl-C60-butyric-N-2-trimethylammonium ethyl ester iodide as a metallic green powder (0.05 g, ~99% yield).

The polymer and the acceptor, $PC_{70}BM$, in a ratio of 1:1.2 were dissolved in chlorobenzene at the concentration of 26 mg/mL to obtain the photoactive layer solution. The solution was stirred and heated at 80° C. overnight in a nitrogen filled glove box. The next day 3.0 vol % of 1,8-diiodooctane (DIO) was added before spin-coating of the photoactive layer.

Indium tin oxide patterned glass substrates were cleaned by successive ultra-sonications in acetone and isopropanol. Each 15 min step was repeated twice and the freshly cleaned substrates were left to dry overnight at 60° C. Preceding fabrication, the substrates were further cleaned for 1.5 min in a UV-ozone chamber and the electron transport layer was immediately spin coated on top.

Sol-gel electron transport layer solution was filtered directly onto the indium tin oxide with a 0.25 μm poly (vinylidene fluoride) filter and spin cast at 4000 rpm for 40 s. Films were then annealed at 170° C. for 15 min, and directly transferred into a nitrogen filled glove box.

The photoactive layer was deposited on the electron transport layer via spin coating at 600 rpm for 40 s with the solution and the substrate being preheated at 110° C. and directly transferred into a glass petri dish for overnight solvent annealing.

After annealing, the substrates were loaded into the vacuum evaporator where $MoO_3$ (hole transport layer) and Ag (anode) were sequentially deposited by thermal evaporation. Deposition occurred at a pressure of $<4 \times 10^{-6}$ torr. $MoO_3$ and Ag had thicknesses of 5.0 nm and 120 nm, respectively. Samples were then encapsulated with glass using an epoxy binder and treated with UV light for 3 min.

Polymer Synthesis

The polymerization can be any conventionally known method of combining the unit A and unit B monomers into a covalently bonded chain or network. In one non-limiting example polymerization can be via Stille cross coupling, Suzuki cross coupling or direct arylation polymerization.

Examples of Polymerization Reactions

Polymer A

From the starting material of 3'-((2-butyloctyl)oxy)-5,5'-bis (trimethylstannyl)-[2,2'-bithiophene]-3-carbonitrile different AB-type copolymers can be made such as:

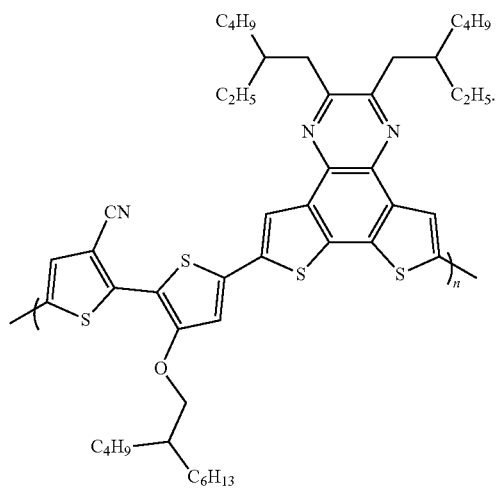

To form

Figure 6:
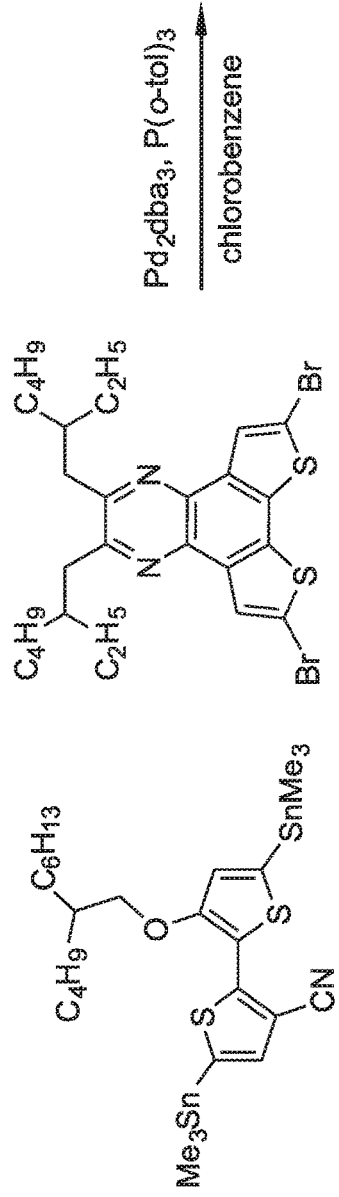
FIG. 6 depicts the formation of AB-type copolymer A.
Figure 6:
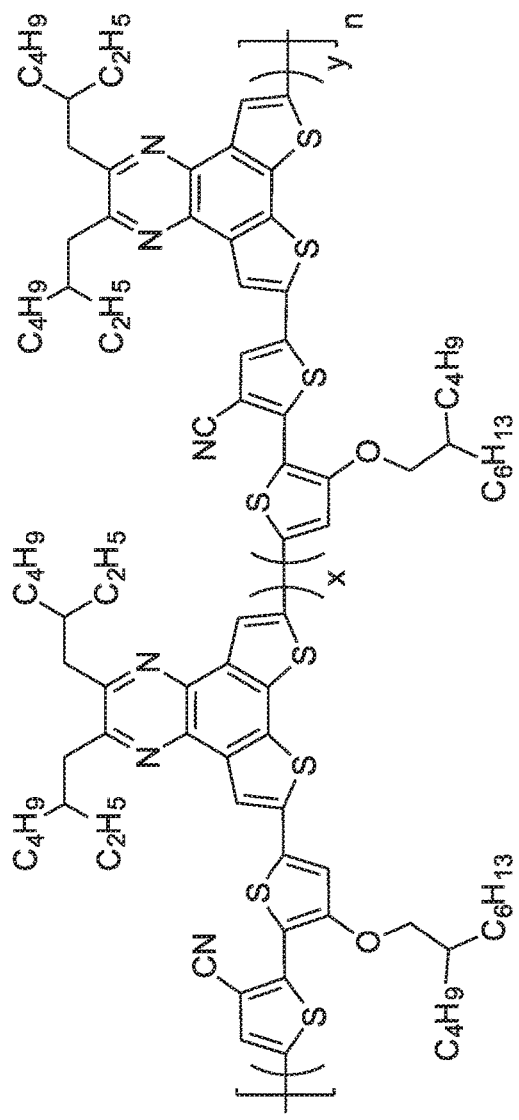

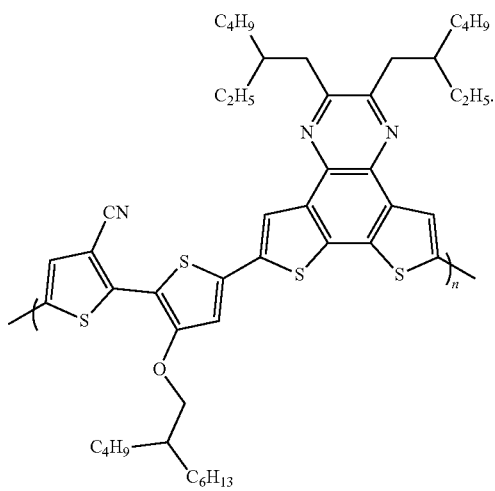

in a 10 mL Schlenk flask, 3'-((2-butyloctyl)oxy)-5,5'-bis(trimethylstannyl)-[2,2'-bithiophene]-3-carbonitrile (129.7 mg, 0.185 mmol), 6,9-dibromo-2,3-bis(2-ethylhexyl)dithieno[3,2-f:2',3'-h]quinoxaline (110.0 mg, 0.176 mmol), tris(dibenzylideneacetone)dipalladium(0) (6.5 mg, 0.007 mmol), and tri(o-tolyl)phosphine (8.6 mg, 0.028 mmol) were combined. The flask was evacuated for 90 minutes, then refilled with argon. Dry chlorobenzene (3.6 mL) was added to the flask, and three freeze-pump-thaw cycles were performed to degas the solvent. The reaction was heated to 125° C. for 64 hours. After cooling to room temperature, the polymer was precipitated into methanol. The polymer was purified by Soxhlet extraction, washing sequentially with acetone, hexanes, and chloroform. The polymer (144 mg, 94% yield) was collected from the chloroform portion. The equation of this reaction is shown in FIG. 6.

Polymer B

Another AB-type copolymer that can be made is

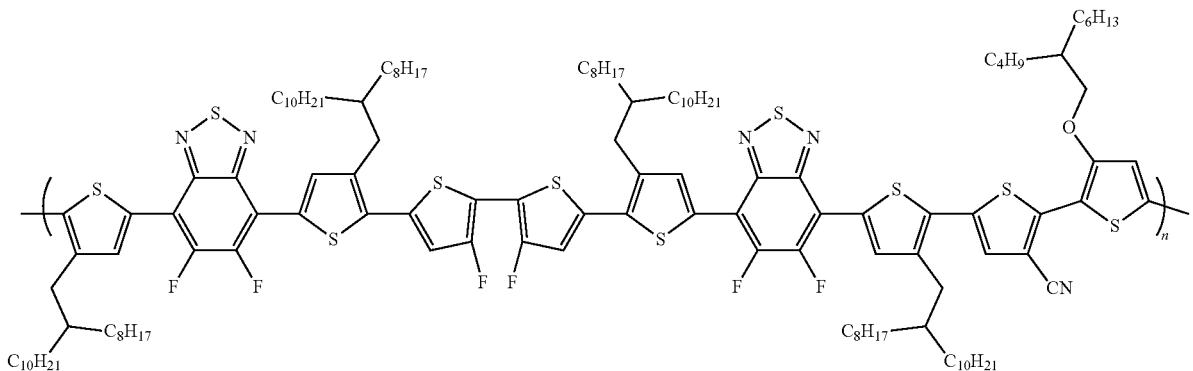

which can also be expressed as

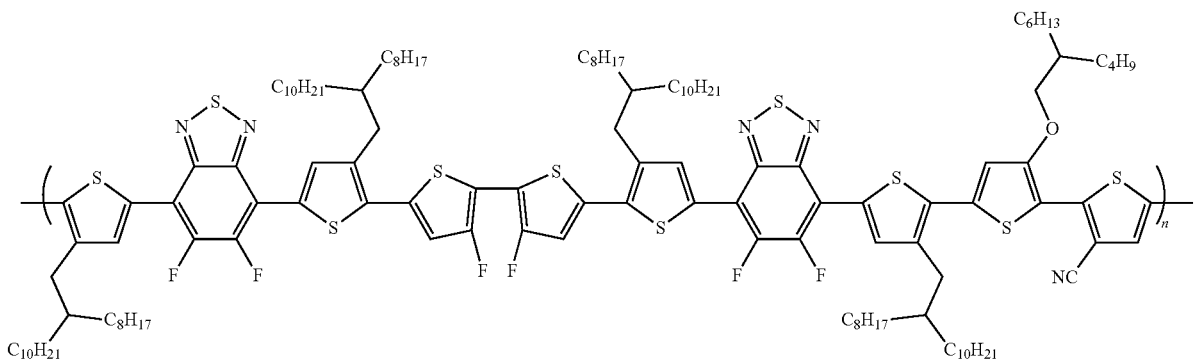

Figure 7:
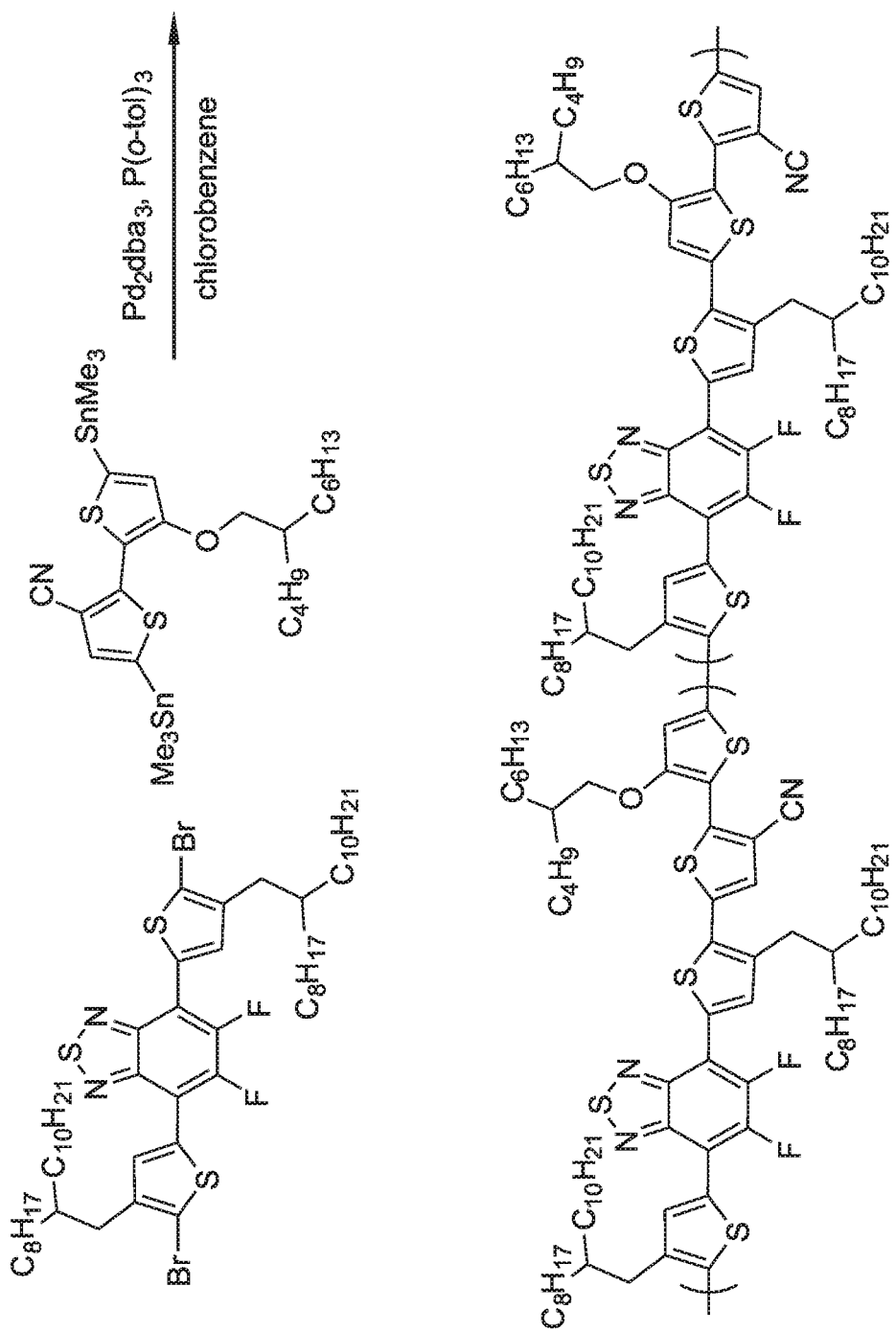
FIG. 7 depicts the formation of AB-type copolymer B.

In a 10 mL Schlenk flask, 3'-((2-butyloctyl)oxy)-5,5'-bis(trimethylstannyl)-[2,2'-bithiophene]-3-carbonitrile (42.5 mg, 0.061 mmol), monomer 1 (124.2 mg, 0.058 mmol), tris(dibenzylideneacetone)dipalladium(0) (2.1 mg, 0.002 mmol), and tri(o-tolyl)phosphine (2.8 mg, 0.009 mmol) were combined. The flask was evacuated for 90 minutes, then refilled with argon. Dry chlorobenzene (1.6 mL) was added to the flask, and three freeze-pump-thaw cycles were performed to degas the solvent. The reaction was heated to 125° C. for 64 hours. After cooling to room temperature, the polymer was precipitated into methanol. The polymer was purified by Soxhlet extraction, washing sequentially with acetone, hexanes, chloroform and chlorobenzene. The polymer was collected from the chloroform and chlorobenzene washes. The fractions were combined to afford the polymer (120 mg, 87% yield). The equation of this reaction is shown in FIG. 7.

Polymer C

Another AB-type copolymer that can be made is

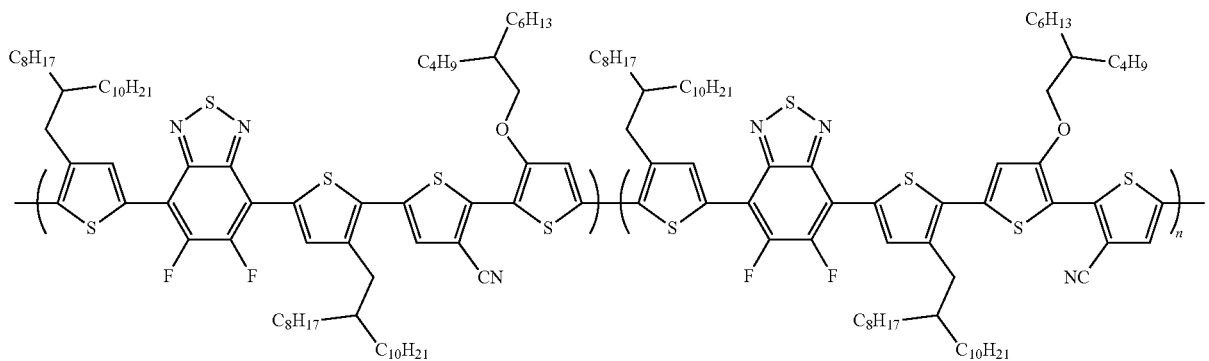

Figure 8:
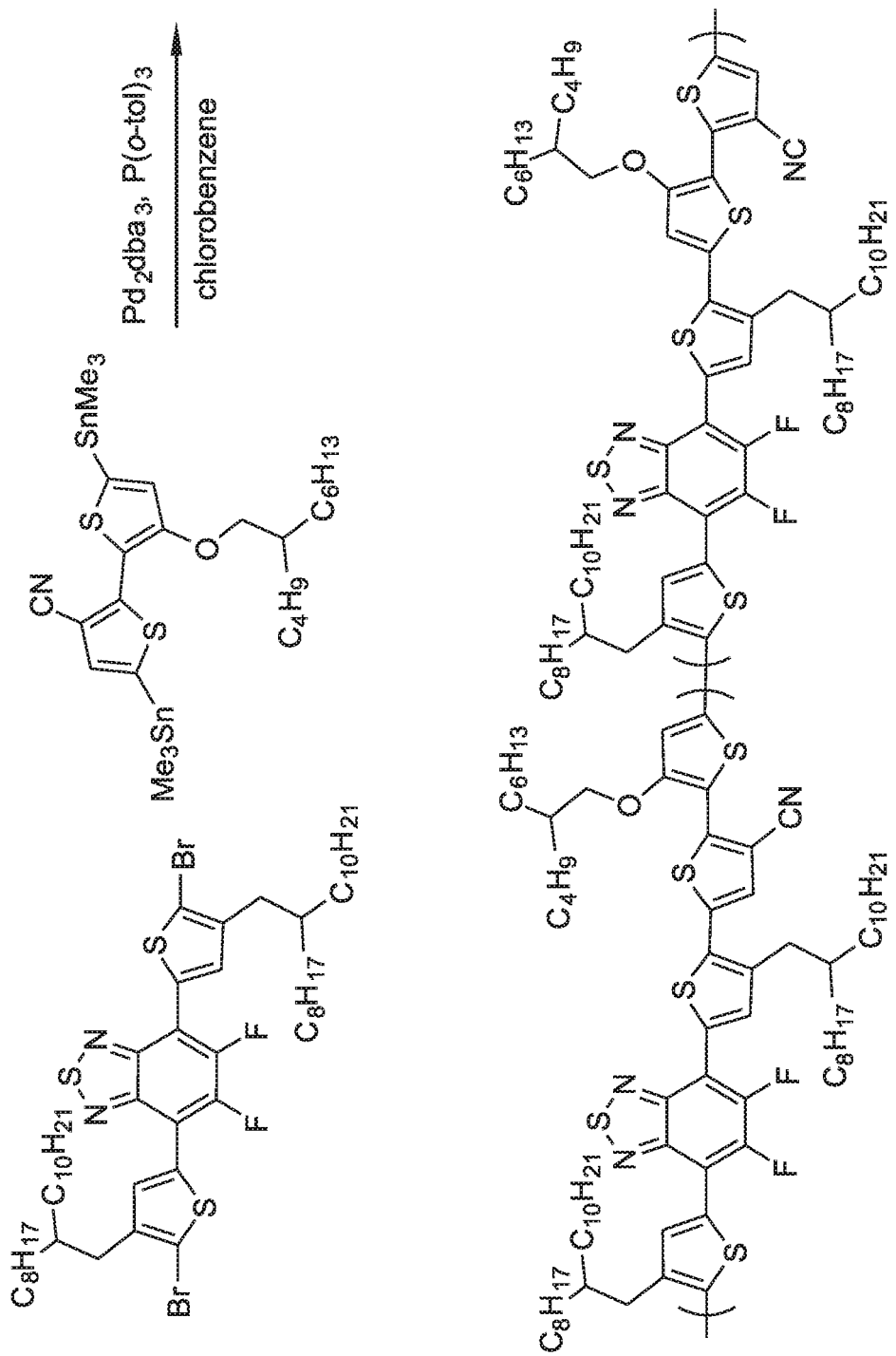
FIG. 8 depicts the formation of AB-type copolymers C.

In a 10 mL Schlenk flask, 3'-((2-butyloctyl)oxy)-5,5'-bis(trimethylstannyl)-[2,2'-bithiophene]-3-carbonitrile (83.7 mg, 0.119 mmol), 4,7-bis(5-bromo-4-(2-octyldodecyl)thiophen-2-yl)-5,6-difluorobenzo[c][1,2,5]thiadiazole (120 mg, 0.114 mmol), tris(dibenzylideneacetone)dipalladium(0) (4.2 mg, 0.005 mmol), and tri(o-tolyl)phosphine (5.5 mg, 0.018 mmol) were combined. The flask was evacuated and refilled with argon (3×). Dry chlorobenzene (2.3 mL) was added to the flask, and three freeze-pump-thaw cycles were performed to degas the solvent. The reaction was heated to 125° C. for 48 hours. After cooling to room temperature, the polymer was precipitated into methanol. The polymer was purified by Soxhlet extraction, washing sequentially with acetone and hexanes. The polymer was collected from the hexanes wash (127 mg, 86% yield). The equation of this reaction is shown in FIG. 8.

Polymer D

Another AB-type copolymer that can be made is

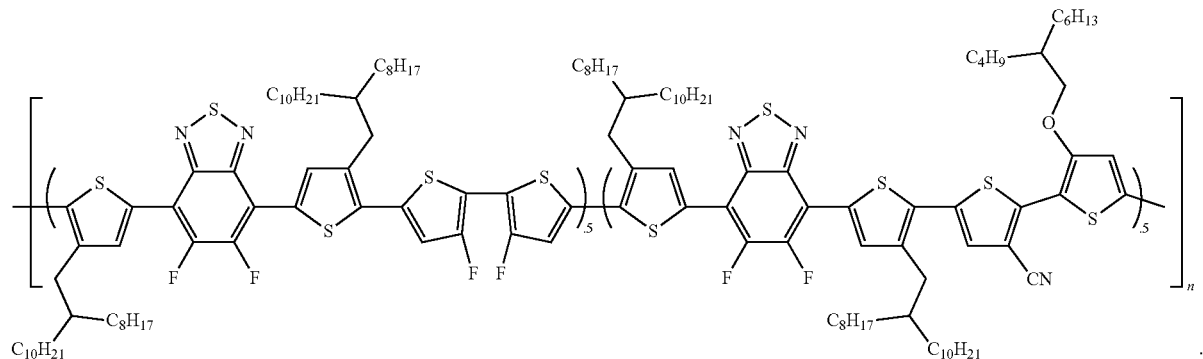

Figure 9:
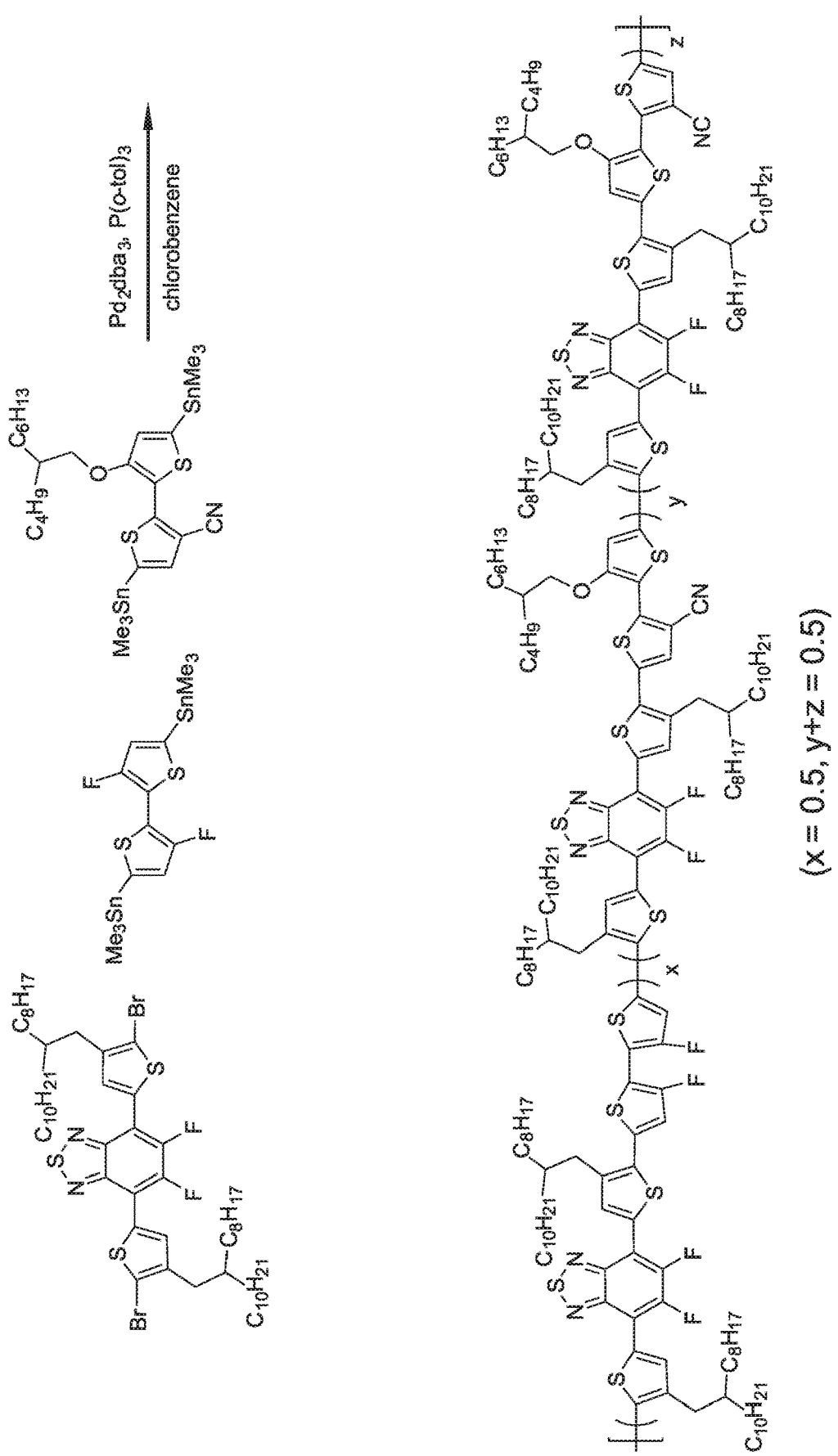
FIG. 9 depicts the formation of AB-type copolymers D.

In a 10 mL Schlenk flask, 3'-((2-butyloctyl)oxy)-5,5'-bis(trimethylstannyl)-[2,2'-bithiophene]-3-carbonitrile (51.9 mg, 0.074 mmol), (3,3'-difluoro-[2,2'-bithiophene]-5,5'-diyl)bis(trimethylstannane) monomer (39.1 mg, 0.074 mmol), 4,7-bis(5-bromo-4-(2-octyldodecyl)thiophen-2-yl)-5,6-difluorobenzo[c][1,2,5]thiadiazole (150 mg, 0.142 mmol), tris(dibenzylideneacetone)dipalladium(0) (5.4 mg, 0.006 mmol), and tri(o-tolyl)phosphine (7.2 mg, 0.024 mmol) were combined. The flask was evacuated and refilled with argon (3×). Dry chlorobenzene (1.5 mL) was added to the flask, and three freeze-pump-thaw cycles were performed to degas the solvent. The reaction was heated to 125° C. for 48 hours. After cooling to room temperature, the polymer was precipitated into methanol. The polymer was purified by Soxhlet extraction, washing sequentially with acetone, hexanes, and chloroform. The polymer was collected from the chloroform wash (69 mg, 41% yield). The equation of this reaction is shown in FIG. 9.

Polymer E

Yet another AB-type copolymer that can be made is

Polymer F

Another AB-type copolymer that can be made is

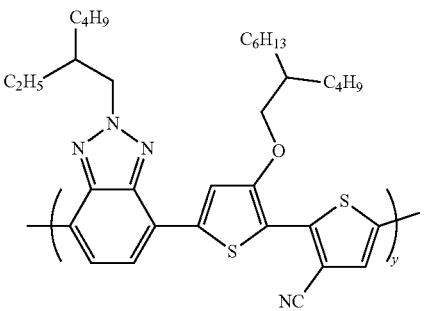

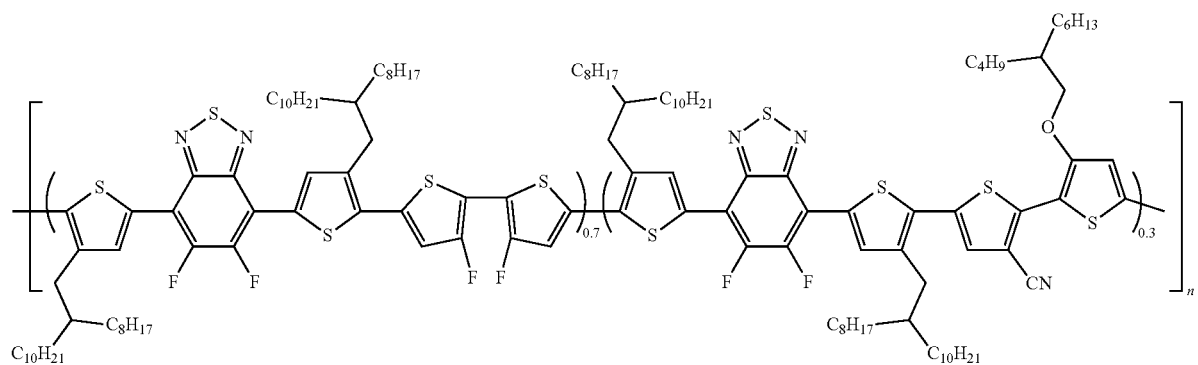

Figure 10:
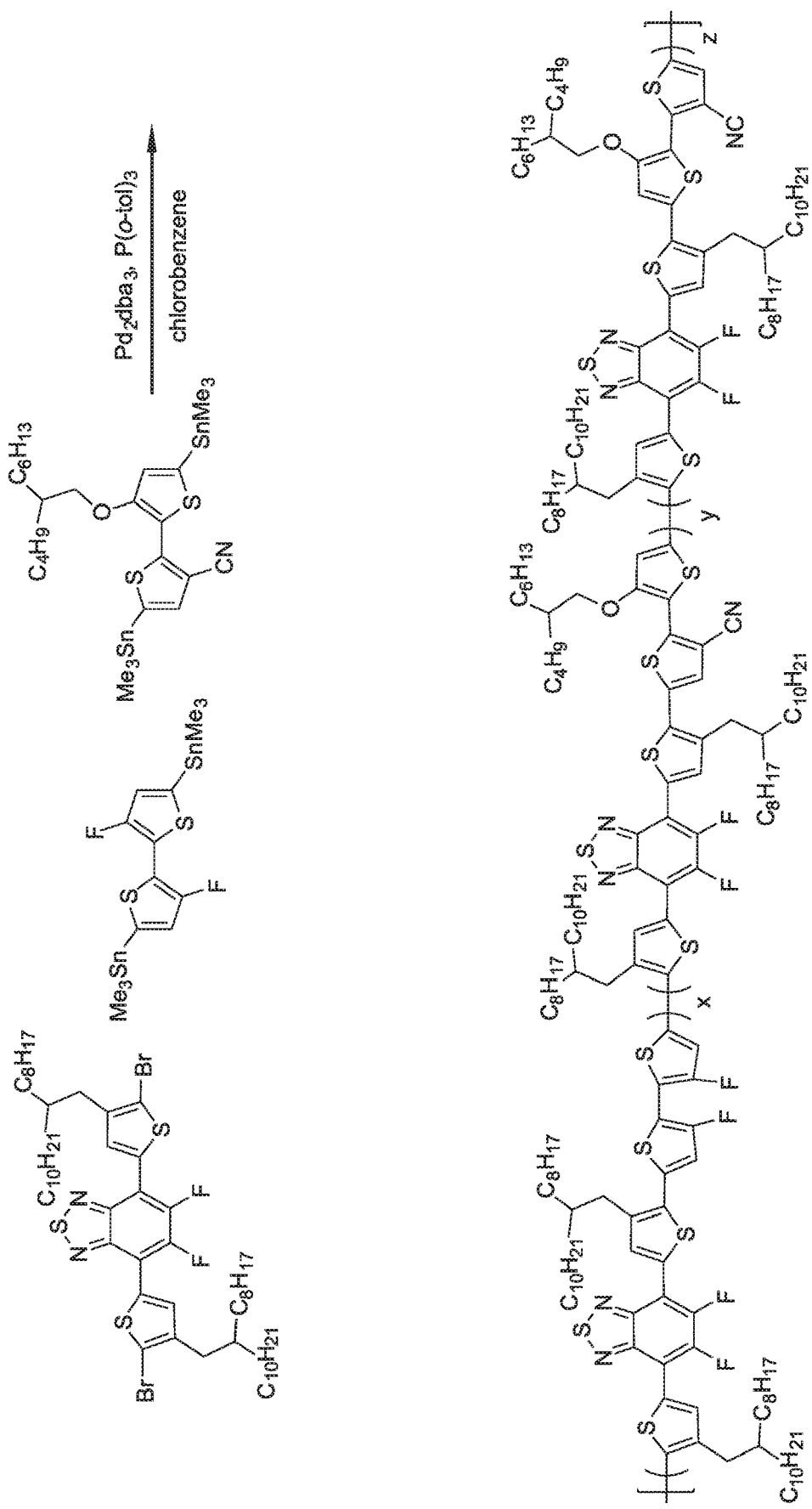
FIG. 10 depicts the formation of AB-type copolymers E.

In a 10 mL Schlenk flask, 3'-((2-butyloctyl)oxy)-5,5'-bis(trimethylstannyl)-[2,2'-bithiophene]-3-carbonitrile (31.1 mg, 0.044 mmol), (3,3'-difluoro-[2,2'-bithiophene]-5,5'-diyl)bis(trimethylstannane) monomer (54.6 mg, 0.103 mmol), 4,7-bis(5-bromo-4-(2-octyldodecyl)thiophen-2-yl)-5,6-difluorobenzo[c][1,2,5]thiadiazole (149.6 mg, 0.142 mmol), tris(dibenzylideneacetone)dipalladium(0) (5.4 mg, 0.006 mmol), and tri(o-tolyl)phosphine (7.2 mg, 0.024 mmol) were combined. The flask was evacuated and refilled with argon (3×). Dry chlorobenzene (1.5 mL) was added to the flask, and three freeze-pump-thaw cycles were performed to degas the solvent. The reaction was heated to 125° C. for 48 hours. After cooling to room temperature, the polymer was precipitated into methanol. The polymer was purified by Soxhlet extraction, washing sequentially with acetone, hexanes, and chloroform. The polymer was collected from the chloroform wash (125 mg, 77% yield). The equation of this reaction is shown in FIG. 10.

which can also be expressed as

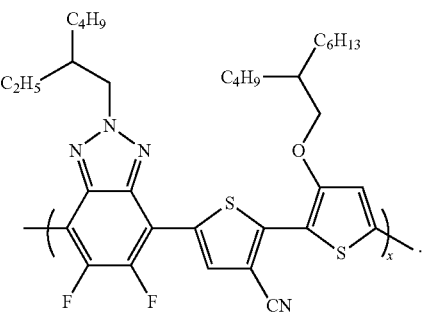

Figure 11:
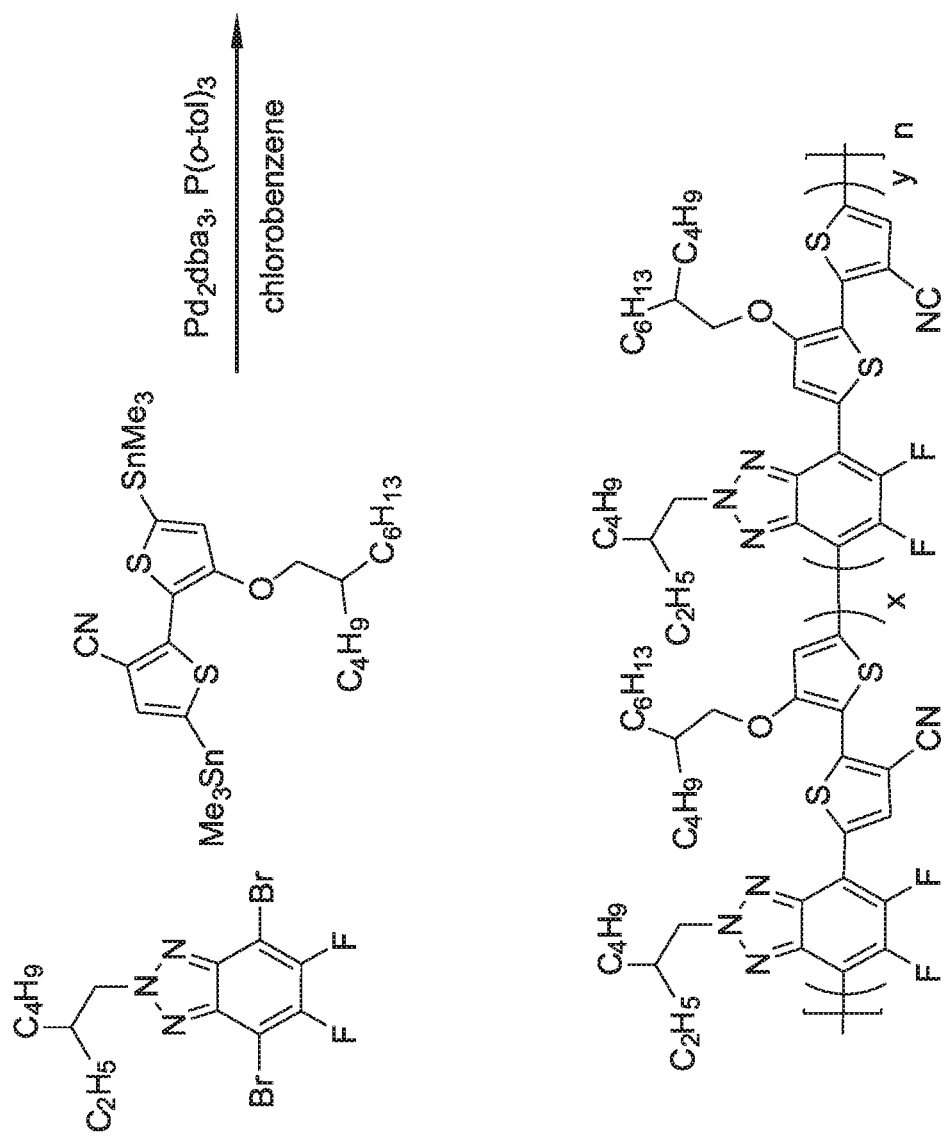
FIG. 11 depicts the formation of AB-type copolymers F.

In a 10 mL Schlenk flask, 3'-((2-butyloctyl)oxy)-5,5'-bis(trimethylstannyl)-[2,2'-bithiophene]-3-carbonitrile (138.6 mg, 0.198 mmol), 4,7-dibromo-2-(2-ethylhexyl)-5,6-difluoro-2H-benzo[d][1,2,3]triazole (80.0 mg, 0.188 mmol), tris(dibenzylideneacetone)dipalladium(0) (6.9 mg, 0.008 mmol), and tri(o-tolyl)phosphine (9.2 mg, 0.030 mmol)

were combined. The flask was evacuated and refilled with argon (3×). Dry chlorobenzene (3.8 mL) was added to the flask, and three freeze-pump-thaw cycles were performed to degas the solvent. The reaction was heated to 125° C. for 64 hours. After cooling to room temperature, the polymer was precipitated into methanol. The polymer was purified by Soxhlet extraction, washing sequentially with acetone, hexanes, and chloroform. The polymer was collected from the chloroform wash (110 mg, 87% yield). The equation of this reaction is shown in FIG. 11.

Polymer G

Another AB-type copolymer that can be made is

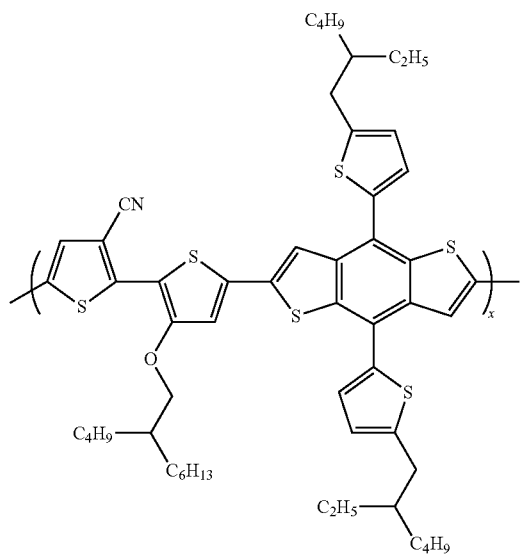

which can be expressed as

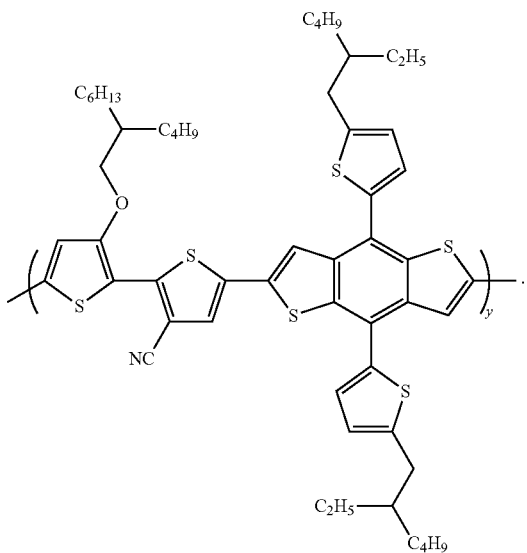

Figure 12:
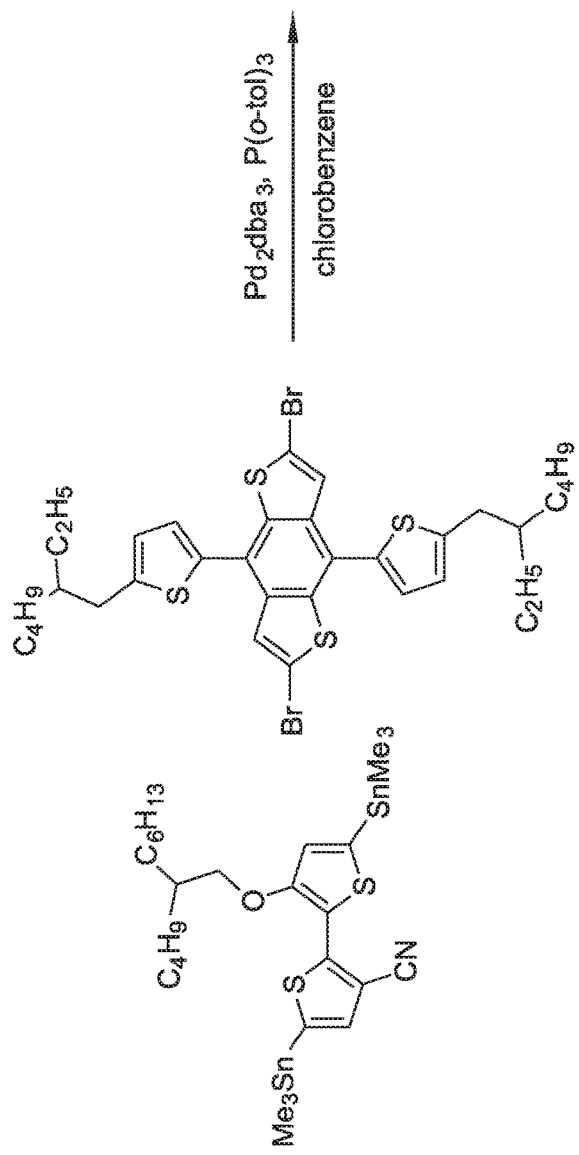
FIG. 12 depicts the formation of AB-type copolymers G.
Figure 12:
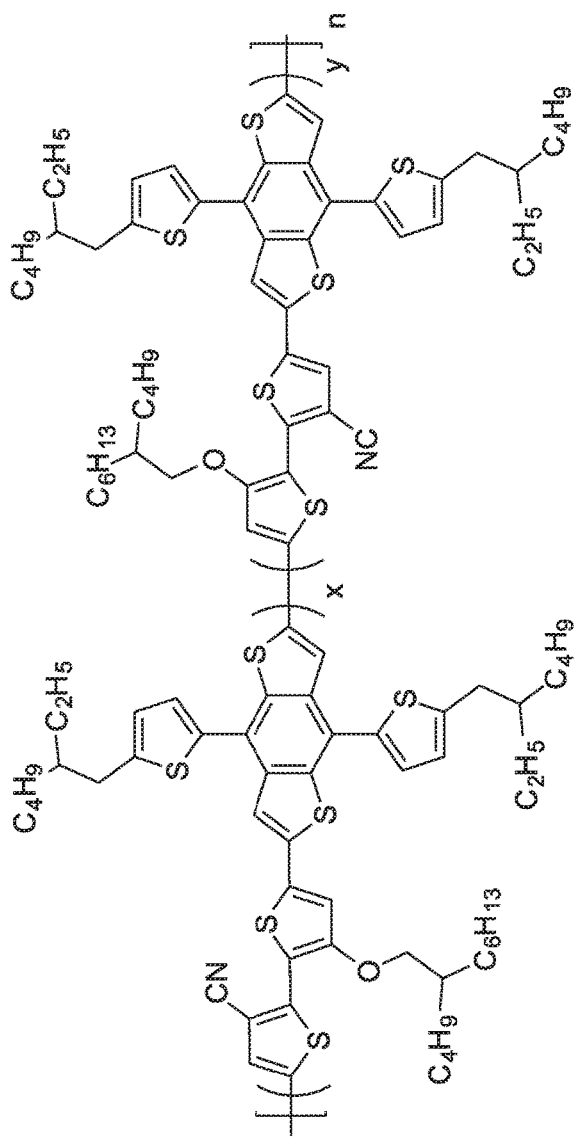
Figure 13:
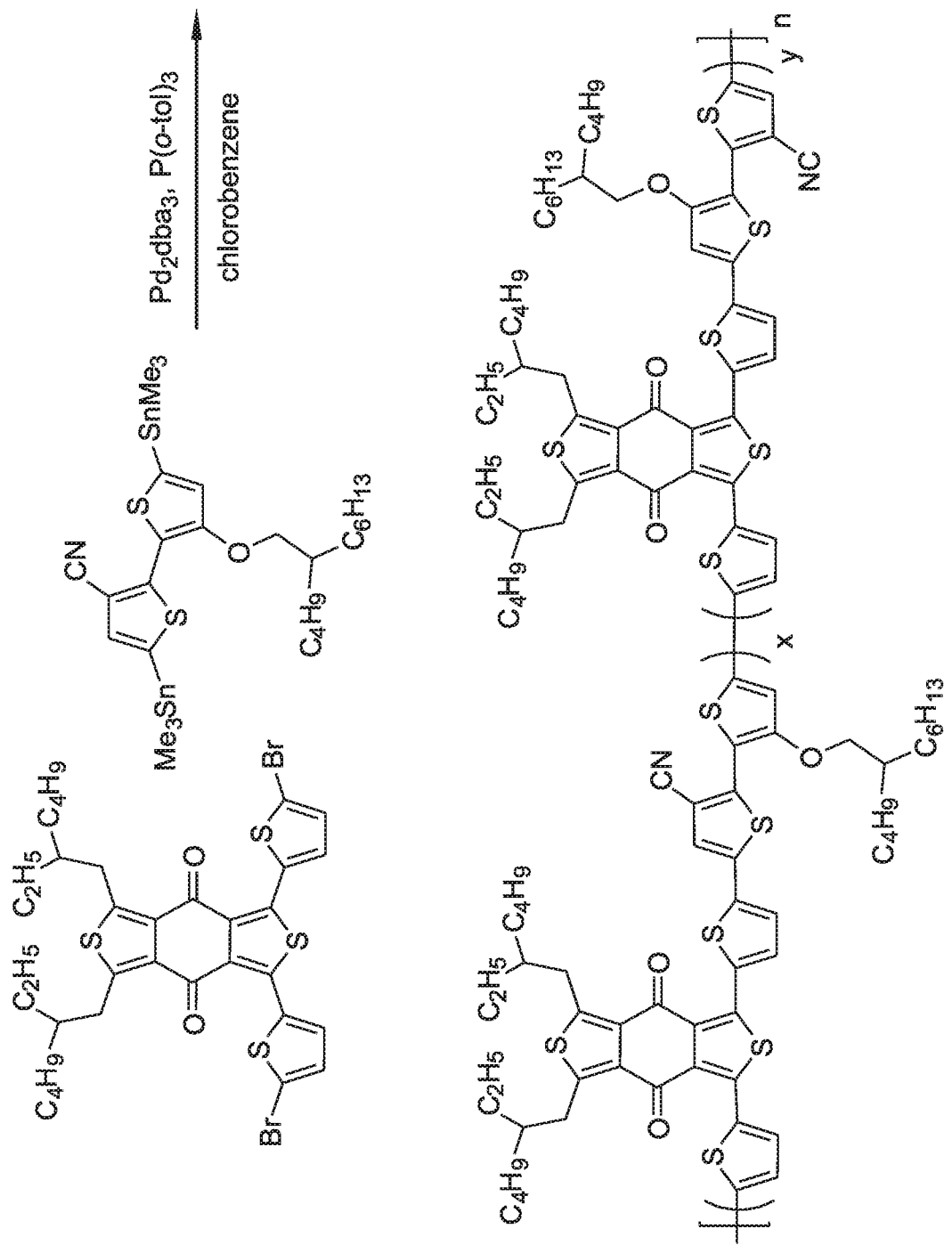
FIG. 13 depicts the formation of AB-type copolymers H.

In a 10 mL Schlenk flask, 3'-((2-butyloctyl)oxy)-5,5'-bis(trimethylstannyl)-[2,2'-bithiophene]-3-carbonitrile (99.9 mg, 0.143 mmol), 2,6-dibromo-4,8-bis(5-(2-ethylhexyl)thiophen-2-yl)benzo[1,2-b:4,5-b']dithiophene (100.0 mg, 0.136 mmol), tris(dibenzylideneacetone)dipalladium(0) (5.0 mg, 0.005 mmol), and tri(o-tolyl)phosphine (6.6 mg, 0.022 mmol) were combined. The flask was evacuated and refilled with argon (3×). Dry chlorobenzene (2.75 mL) was added to the flask, and three freeze-pump-thaw cycles were performed to degas the solvent. The reaction was heated to 125° C. for 64 hours. After cooling to room temperature, the polymer was precipitated into methanol. The polymer was purified by Soxhlet extraction, washing sequentially with acetone, hexanes, and chloroform. The polymer was collected from the chloroform wash (118 mg, 89% yield). The equation of this reaction is shown in FIG. 12.

Polymer H

Another AB type copolymer that can be made is

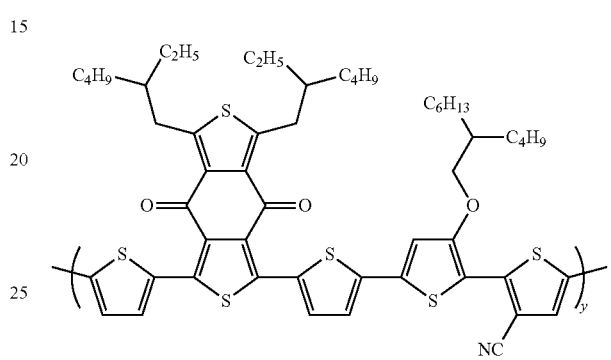

which can be expressed as

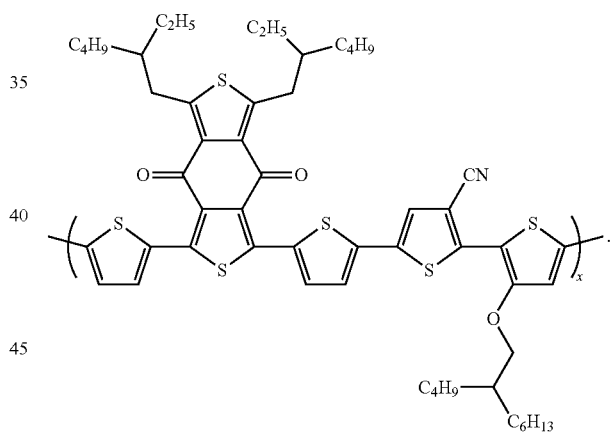

In a 10 mL Schlenk flask, 3'-((2-butyloctyl)oxy)-5,5'-bis(trimethylstannyl)-[2,2'-bithiophene]-3-carbonitrile (100.8 mg, 0.144 mmol), 1,3-bis(5-bromothiophen-2-yl)-5,7-bis(2-ethylhexyl)benzo[1,2-c:4,5-c']dithiophene-4,8-dione (105.0 mg, 0.137 mmol), tris(dibenzylideneacetone)dipalladium(0) (5.0 mg, 0.005 mmol), and tri(o-tolyl)phosphine (6.7 mg, 0.022 mmol) were combined. The flask was evacuated and refilled with argon (3×). Dry chlorobenzene (2.8 mL) was added to the flask, and three freeze-pump-thaw cycles were performed to degas the solvent. The reaction was heated to 125° C. for 43 hours. After cooling to room temperature, the polymer was precipitated into methanol. The polymer was purified by Soxhlet extraction, washing sequentially with acetone, hexanes, chloroform, and chlorobenzene. The polymer was collected from the chlorobenzene wash (70 mg, 51% yield). The equation of this reaction is shown in FIG. 12.

Electron Transport Layer:

Zinc tin oxide (ZTO):phenyl-$C_{60}$-butyric acid-2-N,N,N-trimethylammonium iodide ethyl ester (PCBNMI) sol-gel solutions were prepared by adding zinc acetate dihydrate (996 mg), tin (II) acetate (99.6 mg), and PCBNOH (5 mg) to 2-methoxyethanol (10 mL) and ethanolamine (249 μL). Solutions were stirred for a minimum of 8 hours before use.

An Erichsen COATMASTER 510 was used to spread the electron transport layer on the large area ITO substrates. Approximately 300 μL of the zinc tin oxide:fullerene (ZTO:PCBNMI) sol-gel solution was drawn into a pipette and deposited without filtration, directly onto the ITO at room temperature. A blade, with a gap height set at 300 μm, was then drawn through the ZTO:PCBNMI solution and across the ITO at a printing speed of 20 mm/s to create a uniform film on the substrate. The films were air dried for 15 min before the substrates were removed from the chuck and annealed at 170° C. for 15 min. The deposited film dimension was 8×10 cm.

Acceptors:

Any conventional acceptor, fullerene or non-fullerene, can be used including [6,6]-phenyl-$C_{70}$-butyric acid methyl ester (PCBM) 3,9-bis(2-methylene-(3-(1,1-dicyanomethylene)-indanone))-5,5,11,11-tetrakis(4-hexylphenyl)-dithieno[2,3-d:2',3'-d']-s-indaceno[1,2-b:5,6-b']dithiophene (ITIC) and 3,9-bis(2-methylene-((3-(1,1-dicyanomethylene)-6,7-difluoro)-indanone))-5,5,11,11-tetrakis(4-hexylphenyl)-dithieno[2,3-d:2',3'-d']-s-indaceno[1,2-b:5,6-b']dithiophene (ITIC-DF). The polymer:fullerene ratio can be 1:1.6.

OPV Device Performance

Polymers A, B, D, E, F, G H and their representative acceptors were tested for open-circuitry voltage ($V_{oc}$), power conversion efficiency (PCE), short-circuit current density Jsc (mA/cm$^2$), and fill factor (FF) were tested and the average results shown in Table 1 below.

TABLE 1

| Photoactive Layer | $V_{oc}$ (V) | Jsc (mA/cm$^2$) | FF (%) | PCE (%) |
|---|---|---|---|---|
| Polymer A: PCBM | 0.82 | 13.04 | 65.4 | 7.01 |
| Polymer A: ITIC | 0.92 | 16.80 | 54.7 | 8.43 |
| Polymer B: ITIC-DF | 0.82 | 12.5 | 66.8 | 6.86 |
| Polymer D: ITIC-DF | 0.82 | 6.52 | 55.8 | 3.00 |
| Polymer E: ITIC-DF | 0.85 | 10.5 | 50.6 | 4.53 |
| Polymer F: ITIC-DF | 0.86 | 13.9 | 53.5 | 6.38 |
| Polymer G: ITIC | 0.92 | 14.1 | 64.3 | 8.27 |
| Polymer H ITIC | 0.82 | 10.2 | 48.4 | 4.07 |

Jsc (mA/cm$^2$) Short-circuit current density (Jsc) is the current density that flows out of the solar cell at zero bias. $V_{oc}$ (V) Open-circuit voltage ($V_{oc}$) is the voltage for which the current in the external circuit is zero. Fill factor percentage (FF %) is the ratio of the maximum power point divided by the open circuit voltage and the short circuit current. PCE (%) The power conversion efficiency (PCE) of a photovoltaic cell is the percentage of the solar energy shining on a photovoltaic device that is converted into usable electricity.

Polymer Comparison

Two polymers are compared:

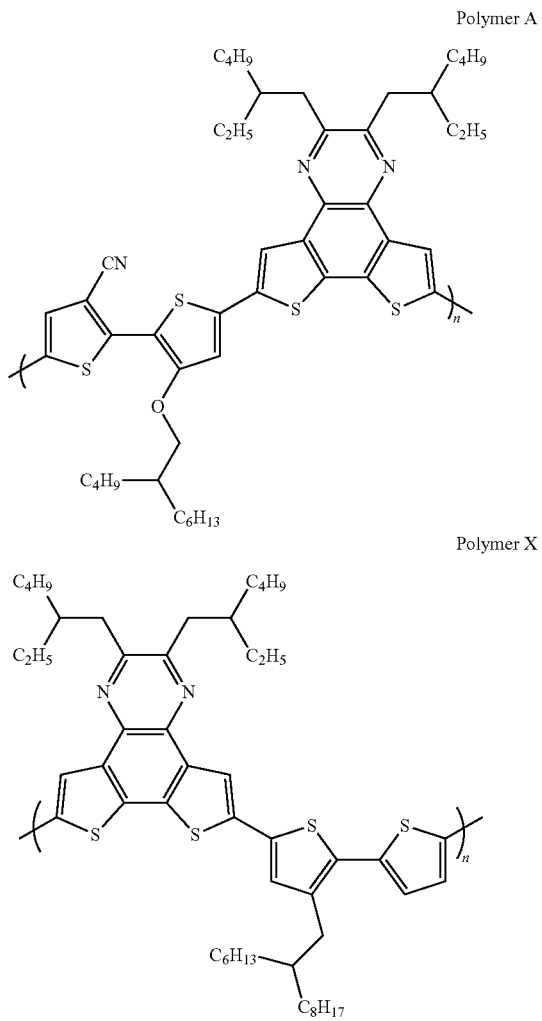

Figure 14:
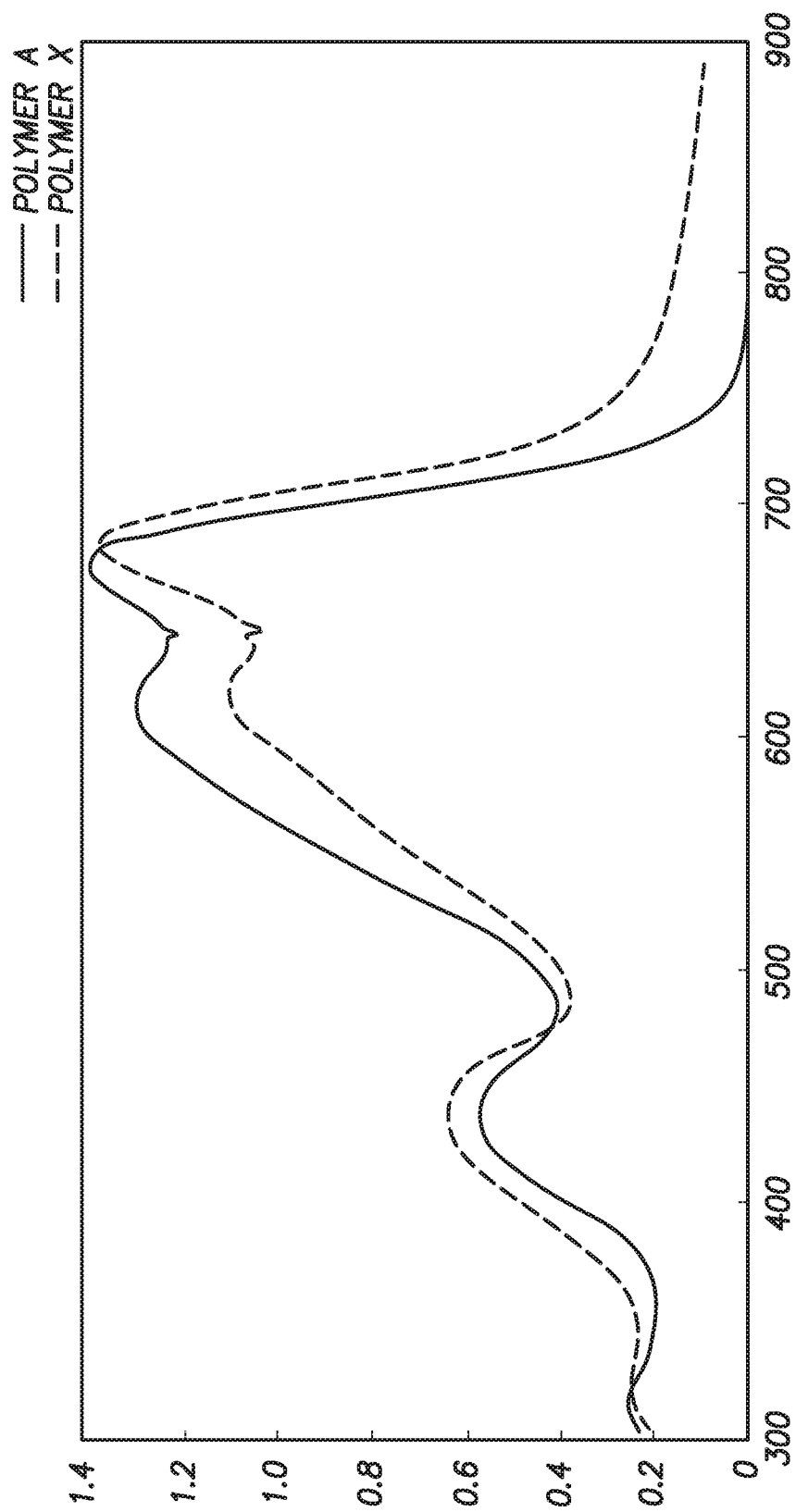
FIG. 14 depicts the UV-visible absorbance of polymer A to polymer X.

When 3'-((2-butyloctyl)oxy)-[2,2'-bithiophene]-3-carbonitrile is incorporated to the polymer, compared to alkyl bi-thiophene, the UV-visible absorbance is broadened, which will allow for enhanced light harvesting in OPVs. Please see FIG. 14.

Table 2 below demonstrates the significant improvement to the performance from using Polymer A and Polymer X.

TABLE 2

| Photoactive Layer | $V_{oc}$ (V) | Jsc (mA/cm$^2$) | FF (%) | PCE (%) |
|---|---|---|---|---|
| Polymer A: ITIC | 0.92 | 16.80 | 54.7 | 8.43 |
| Polymer X: ITIC | 0.94 | 11.36 | 64.2 | 6.79 |

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. An AB-type copolymer comprising:

A is

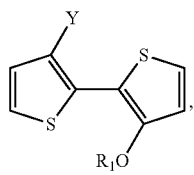

where $R_1$ is a carbon chain from about 1 to about 30 units and Y is selected from CN, F and Cl;

a unit B, where the unit B is selected from:

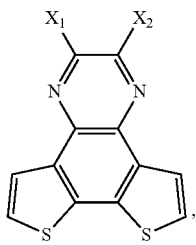

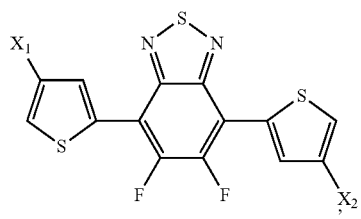

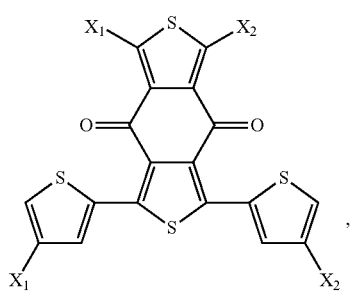

-continued

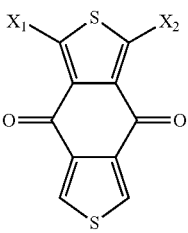 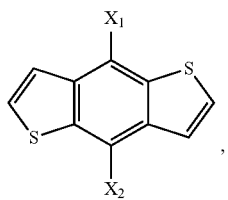

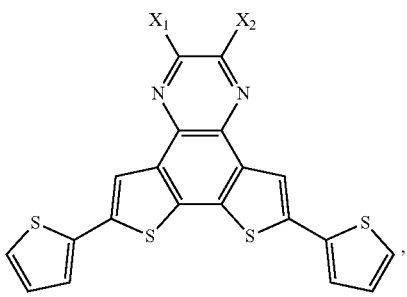

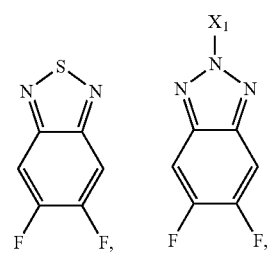

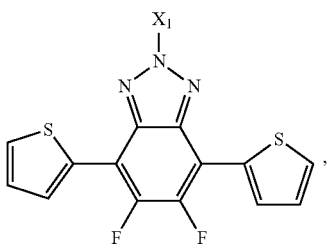 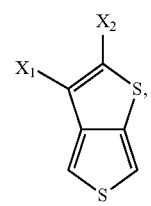

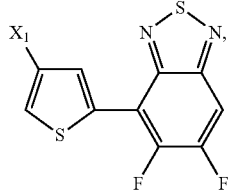

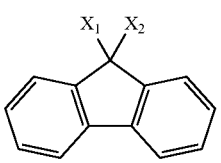 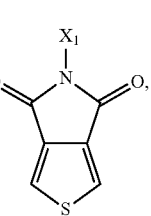

-continued

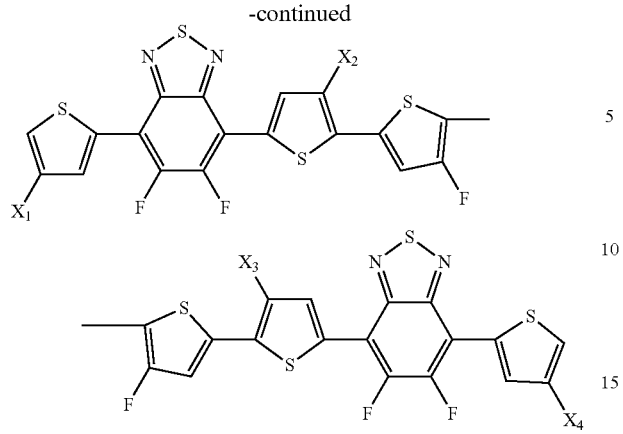

wherein
X₁, X₂, X₃, and X₄ are independently selected from the group consisting of: H, Cl, F, CN, alkyl, alkylthiol, alkoxy, ester, ketone, amide and aryl groups.

2. The AB-type copolymer of claim 1, wherein $R_1$ is a linear or branched carbon chain.

3. The AB-type copolymer of claim 1, wherein unit A and unit B can be combined AB or BA.

4. The AB-type copolymer of claim 1, wherein the AB-type copolymer comprises:

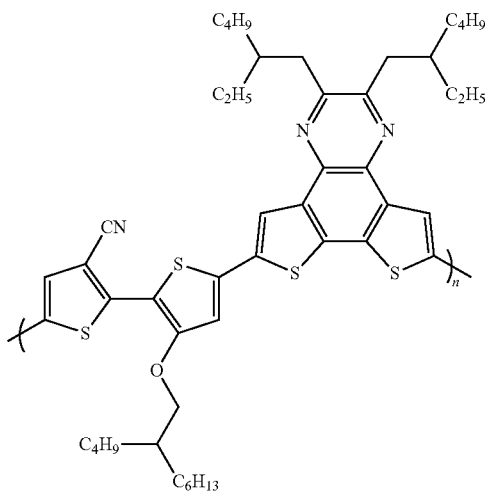

and n ranges from about 1 to about 1000.

5. The AB-type copolymer of claim 1, wherein the AB-type copolymer comprises:

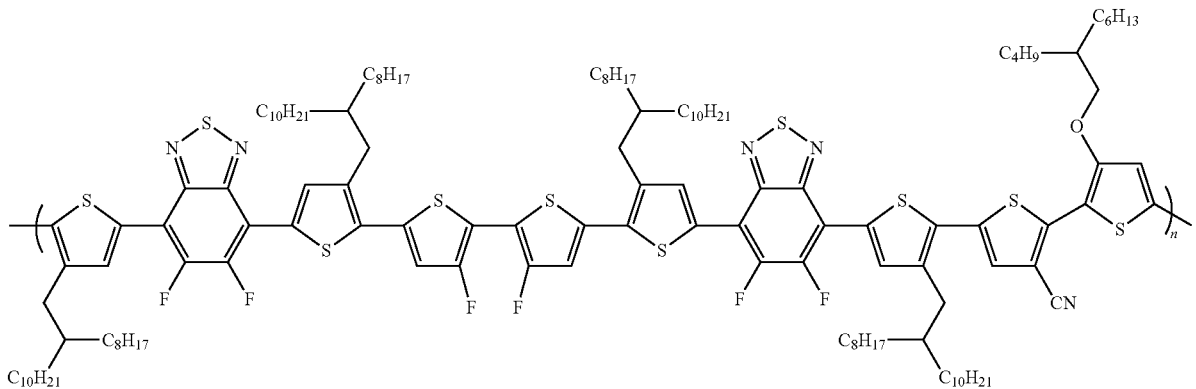

and n ranges from about 1 to about 1000.

6. The AB-type copolymer of claim 1, wherein the AB-type copolymer comprises:

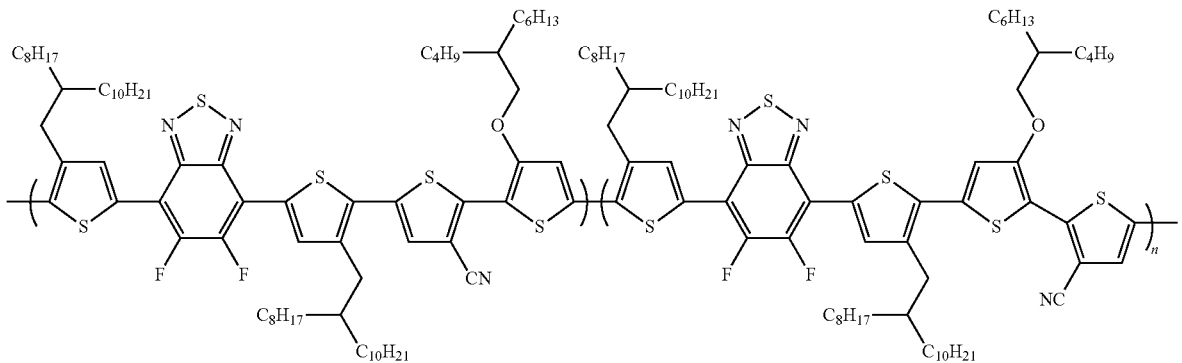

and n ranges from about 1 to about 1000.

7. The AB-type copolymer of claim 1, wherein the AB-type copolymer comprises:

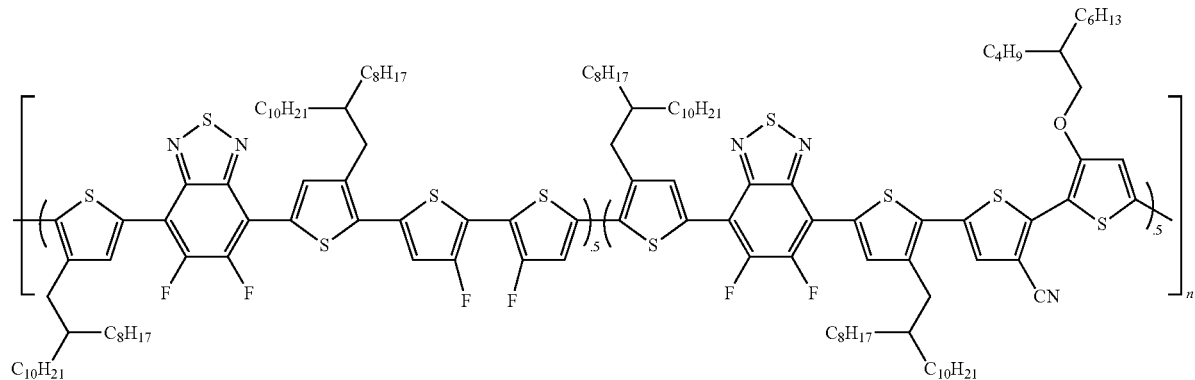

and n ranges from about 1 to about 1000.

8. The AB-type copolymer of claim 1, wherein the AB-type copolymer comprises:

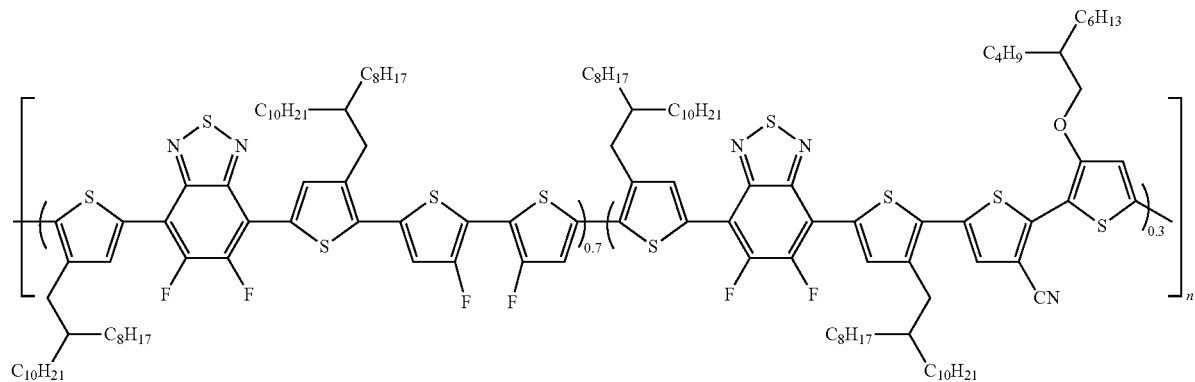

and n ranges from about 1 to about 1000.

9. The AB-type copolymer of claim 1, wherein the AB-type copolymer comprises:

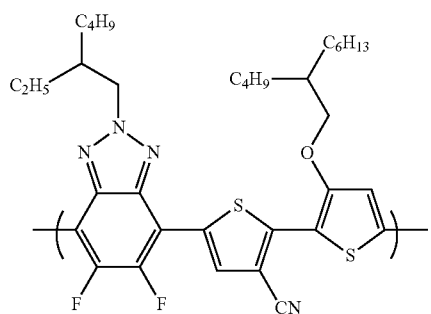

and n ranges from about 1 to about 1000.

10. The AB-type copolymer of claim 1, wherein the AB-type copolymer comprises:

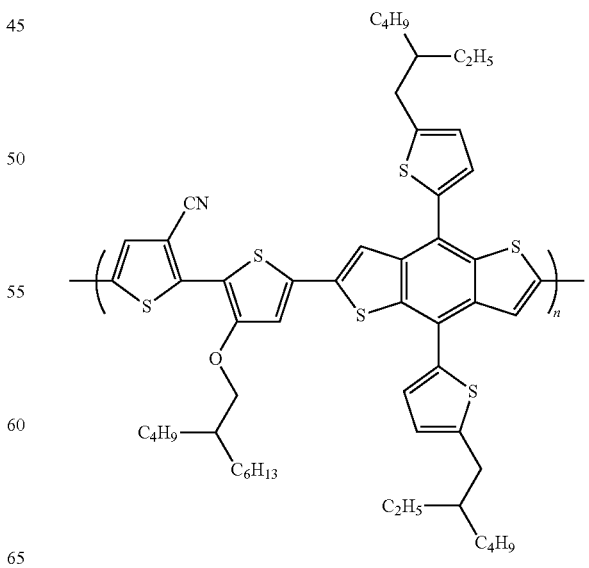

and n ranges from about 1 to about 1000.

11. The AB-type copolymer of claim 1, wherein the AB-type copolymer comprises:
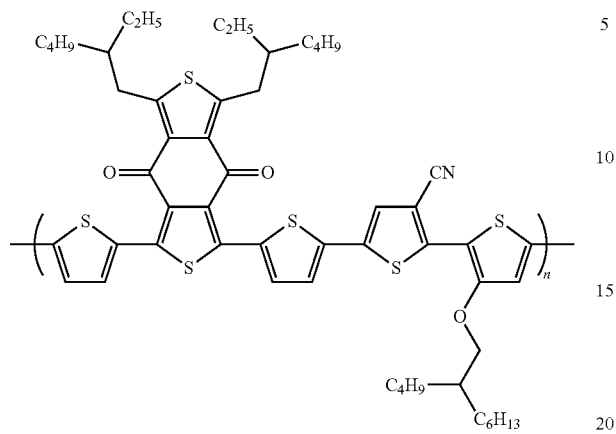
and n ranges from about 1 to about 1000.
* * * * *